US009760311B1

(12) United States Patent
Amir et al.

(10) Patent No.: US 9,760,311 B1
(45) Date of Patent: Sep. 12, 2017

(54) STORAGE SYSTEM AND METHOD FOR ADAPTIVE THERMAL THROTTLING

(71) Applicant: SanDisk Technologies LLC, Plano, TX (US)

(72) Inventors: Nir Amir, Beit Hasmoni (IL); Gadi Vishne, Petah-Tikva (IL); Joshua Lehmann, Modin (IL); Judah Hahn, Ofra (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/190,974

(22) Filed: Jun. 23, 2016

(51) Int. Cl.
*G11C 5/14* (2006.01)
*G06F 3/06* (2006.01)
*G06F 1/20* (2006.01)
*G11C 7/20* (2006.01)

(52) U.S. Cl.
CPC ............ *G06F 3/0659* (2013.01); *G06F 1/206* (2013.01); *G06F 3/0616* (2013.01); *G06F 3/0632* (2013.01); *G06F 3/0653* (2013.01); *G06F 3/0679* (2013.01); *G11C 5/14* (2013.01); *G11C 7/20* (2013.01)

(58) Field of Classification Search
CPC ........... G11C 5/14; G11C 5/144; G11C 5/147; G11C 7/20; G11C 11/40672; G11C 11/4072; G11C 16/30; G06F 1/206; G06F 3/0616; G06F 3/0632; G06F 3/0653; G06F 3/0659; G06F 3/0679
USPC ......... 365/226, 211, 227; 713/300, 320, 340
See application file for complete search history.

(56) References Cited

U.S. PATENT DOCUMENTS

| 5,483,486 A | 1/1996 | Javanifard et al. |
| 5,845,142 A | 12/1998 | Hayasaka |
| 6,021,076 A * | 2/2000 | Woo ........................ G06F 1/206 365/211 |

(Continued)

FOREIGN PATENT DOCUMENTS

| TW | 200809469 A | 2/2008 |
| TW | 200937178 A | 9/2009 |

OTHER PUBLICATIONS

Office Action and Search Report, and English language translation thereof, in Taiwanese Application No. 099140091 dated Jul. 31, 2015, 7 pages.

(Continued)

*Primary Examiner* — Tan T. Nguyen
(74) *Attorney, Agent, or Firm* — Brinks Gilson & Lione

(57) ABSTRACT

A storage system and method for adaptive thermal throttling are disclosed. In one embodiment, a method for adaptive thermal throttling is provided that is performed in a storage system having a memory. This method comprises determining if a temperature of the storage system is above a threshold temperature; and in response to determining that the temperature of the storage system is above the threshold temperature: reducing performance of the storage system in an iterative manner until the temperature of the storage system is within a temperature envelope around the threshold temperature; and storing, in the memory, a value indicating what the performance of the storage system was reduced to in order to get the temperature within the temperature envelope. Other embodiments are possible, and each of the embodiments can be used alone or together in combination.

24 Claims, 22 Drawing Sheets

(56) References Cited

U.S. PATENT DOCUMENTS

| | | | |
|---|---|---|---|
| 6,552,945 B2* | 4/2003 | Cooper | G11C 7/04 365/211 |
| 7,064,994 B1* | 6/2006 | Wu | G06F 1/206 365/211 |
| 7,272,063 B1* | 9/2007 | Egerer | G11C 7/04 365/211 |
| 7,370,168 B2 | 5/2008 | Kanamori et al. | |
| 7,394,694 B2 | 7/2008 | Micheloni et al. | |
| 7,782,683 B2 | 8/2010 | Sohn et al. | |
| 7,818,592 B2 | 10/2010 | Meier et al. | |
| 8,304,698 B1 | 11/2012 | Tischler | |
| 8,335,123 B2 | 12/2012 | Sprouse | |
| 8,363,442 B2 | 1/2013 | Liu et al. | |
| 8,654,563 B2 | 2/2014 | Confalonieri et al. | |
| 8,837,217 B2 | 9/2014 | Chu | |
| 2005/0071701 A1 | 3/2005 | Luick | |
| 2007/0211551 A1 | 9/2007 | Yogev et al. | |
| 2008/0263373 A1 | 10/2008 | Meier et al. | |
| 2009/0190427 A1* | 7/2009 | Brittain | G06F 13/1684 365/212 |
| 2011/0122691 A1 | 5/2011 | Sprouse | |
| 2013/0003555 A1 | 1/2013 | Moran et al. | |
| 2014/0254285 A1* | 9/2014 | Eguchi | G11C 7/04 365/185.29 |
| 2015/0148981 A1 | 5/2015 | Kong et al. | |
| 2016/0026231 A1* | 1/2016 | Ignowski | G06F 1/206 713/320 |
| 2016/0062421 A1* | 3/2016 | Sugawara | G06F 1/206 700/299 |
| 2016/0085290 A1 | 3/2016 | Skandakumaran et al. | |

OTHER PUBLICATIONS

Erez, E., U.S. Appl. No. 14/741,075 entitled, "Memory System and Method for Power Management", filed Jun. 16, 2015, 48 pages.
Erez, E., U.S. Appl. No. 14/741,045 entitled, "Memory System and Method for Power Management", filed Jun. 16, 2015, 48 pages.
Erez, E., U.S. Appl. No. 14/757,780 entitled, "Memory System and Method for Power Management", filed Dec. 23, 2015, 60 pages.
Ex Parte Quayle Action for U.S. Appl. No. 14/741,045 dated Feb. 11, 2016, 14 pages.
Office Action for U.S. Appl. No. 14/741,075, dated Mar. 23, 2016, 7 pages.
Notice of Allowance for U.S. Appl. No. 14/741,075, dated Jun. 14, 2016, 5 pages.
Notice of Allowance for U.S. Appl. No. 14/741,045, dated Jun. 28, 2016, 7 pages.
Office Action for U.S. Appl. No. 14/757,780, dated Jan. 4, 2017, 9 pages.
Office Action for U.S. Appl. No. 15/207,221, dated Jan. 4, 2017, 11 pages.
International Search Report and Written Opinion in PCT/US2017/018884, dated Jun. 8, 2017, 14 pages.

* cited by examiner

| Set Number | Unconstraint Power [W] | SSD Allowed Power [W] | Power Burst Duration [mSec] | Bucket Capacity [tokens] | Steady State Power [W] | Bucket Fill Rate [tokens/sec] | Usage |
|---|---|---|---|---|---|---|---|
| 1 | 5 | 3 | 5 | 25,000 | 2.99 | 2,989,950 | Sustain |
| 2 | 5 | 3 | 10 | 50,000 | 2.98 | 2,979,798 | |
| 3 | 5 | 3 | 15 | 75,000 | 2.97 | 2,969,543 | |
| 4 | 5 | 3 | 20 | 100,000 | 2.96 | 2,959,184 | |
| 5 | 5 | 3 | 25 | 125,000 | 2.95 | 2,948,718 | Burst |

FIG. 14

| Operation | Token Cost |
|---|---|
| Program Transfer | p |
| NAND Program | n |
| Read Transfer | r |
| NAND Sense | s |

FIG. 17

STORAGE SYSTEM AND METHOD FOR ADAPTIVE THERMAL THROTTLING

BACKGROUND

Some memory systems, such as solid-state drives (SSDs), contain a plurality of memory dies (e.g., in a multi-die package) that can be read or written in parallel. Different operations may consume different energy. For example, some operations (e.g., program operations) may require higher energy than others (e.g. read operations). Memory systems typically have a maximum power and/or temperature threshold that limits the number of operations that can be executed at any given time and/or the number of dies that can be used at any given time.

BRIEF DESCRIPTION OF THE DRAWINGS

FIG. 14 is a table of different energy bucket configurations of an embodiment.

FIG. 17 is a chart of an embodiment of token costs for various operations.

DETAILED DESCRIPTION OF THE PRESENTLY PREFERRED EMBODIMENTS

Overview

Figure 1A:
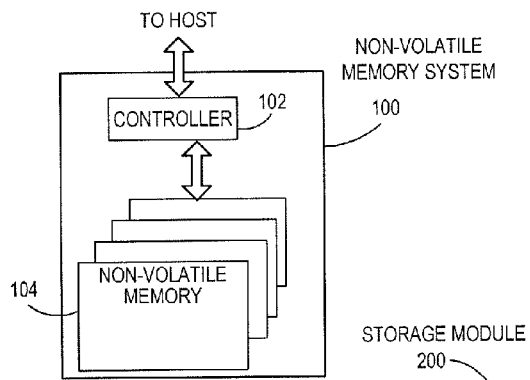
FIG. 1A is a block diagram of a non-volatile memory system of an embodiment.

By way of introduction, the below embodiments relate to a storage system and method for adaptive thermal throttling. In one embodiment, a method for adaptive thermal throttling is provided that is performed in a storage system having a memory. This method comprises determining if a temperature of the storage system is above a threshold temperature; and in response to determining that the temperature of the storage system is above the threshold temperature: reducing performance of the storage system in an iterative manner until the temperature of the storage system is within a temperature envelope around the threshold temperature; and storing, in the memory, a value indicating what the performance of the storage system was reduced to in order to get the temperature within the temperature envelope.

In some embodiments, the method further comprises reducing the performance of storage system to the stored value a next time that the temperature of the storage system is above threshold temperature.

In some embodiments, the method further comprises increasing performance of the storage system if the temperature of the storage system is below a lower limit of the temperature envelope.

In some embodiments, the method further comprises reducing performance of the storage system to a minimum performance value in response to the temperature of the storage system being above a higher limit of the temperature envelope by more than a certain margin.

In some embodiments, the method is performed during initialization of the storage system.

In some embodiments, the performance of the storage system is reduced by reducing a number of power tokens that are available to perform memory operations.

In some embodiments, the performance of the storage system is reduced by inserting delays between read and/or write commands.

In some embodiments, the memory is a three-dimensional memory.

In some embodiments, the storage system is embedded in a host.

In some embodiments, the storage system is removably connected to a host.

In another embodiment, a storage system is provided comprising a memory and a controller. The controller is configured to detect that a temperature of the storage system exceeds a critical temperature; throttle execution of memory commands to bring the temperature of the storage system to about the critical temperature; save throttling parameters that were used bring the temperature of the storage system to about the critical temperature; and use the throttling parameters when the temperature of the storage system again exceeds the critical temperature.

In some embodiments, the controller is further configured to increase execution of memory commands when the temperature of the storage system is below the critical temperature by more than a predefined amount.

In some embodiments, the controller is further configured to throttle execution of memory commands to a minimum amount when the temperature of the storage system is above the critical temperature by more than a predefined amount.

In some embodiments, the controller is configured to throttle execution of memory commands by reducing a number of power tokens that are available to perform memory commands.

In some embodiments, the controller is configured to throttle execution of memory commands by inserting delays between the memory commands.

In some embodiments, the memory is a three-dimensional memory.

In some embodiments, the storage system is embedded in a host.

In some embodiments, the storage system is removably connected to a host.

In another embodiment, a storage system is provided comprising a memory; and means for, when a temperature of the storage system is greater than a target temperature, reducing performance of the storage system until the temperature of the storage system is within the target temperature, wherein such reduced performance is used later when the temperature of the storage system is again greater than the target temperature.

In some embodiments, the means comprises a controller.

In some embodiments, the means uses power tokens to reduce performance.

In some embodiments, the memory is a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
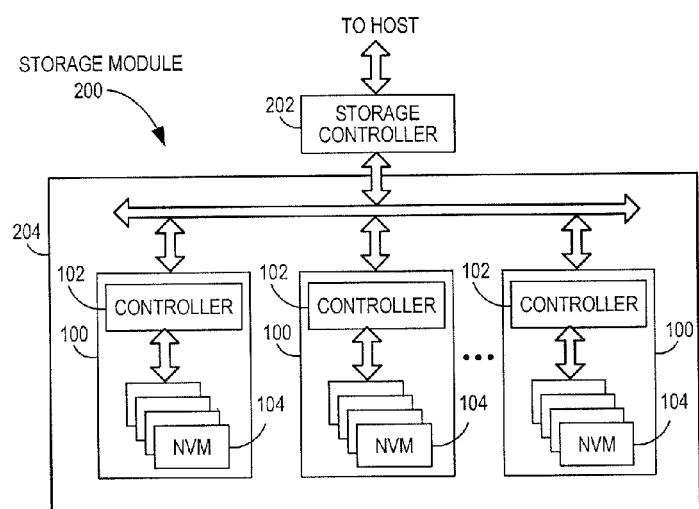
FIG. 1B is a block diagram illustrating an exemplary storage module of an embodiment.
Figure 1C:
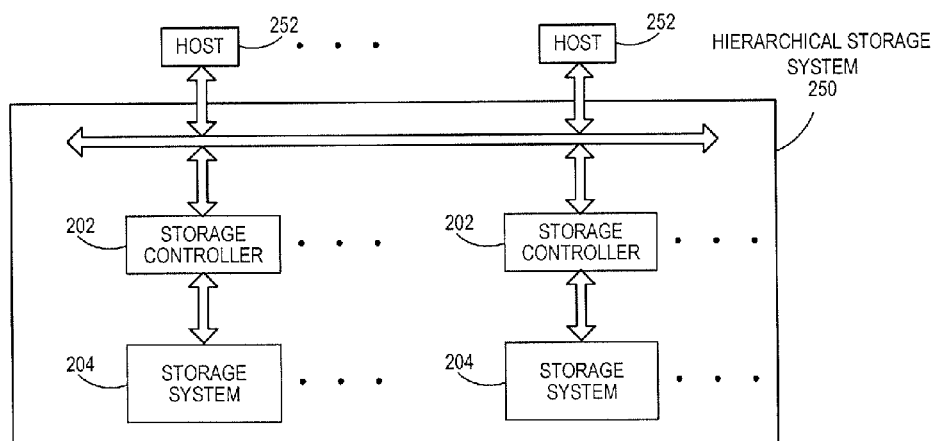
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system 100 according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
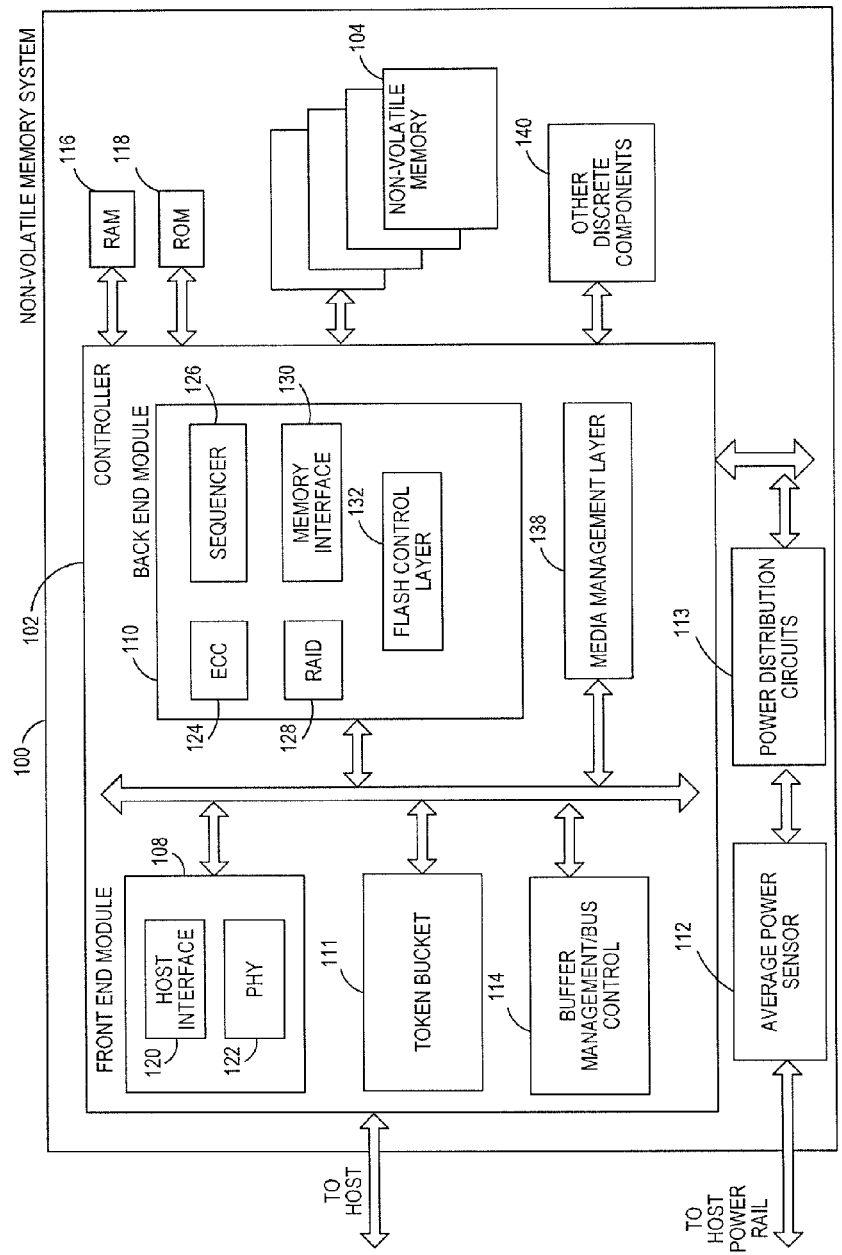
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a power-based operation scheduling module 111 configured to execute operations stored in a queue (e.g., RAM 116) in an order in which they are stored in the queue unless performing an operation would exceed a maximum power limit, in which case the power-based operation scheduling module 111 is configured to perform another operation stored in the queue, so the maximum power limit would not be exceeded. These modules will be discussed in more detail below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include a token bucket 111 (sometimes referred to herein as an energy bucket). In one embodiment, the token bucket 111 is used to control, power use in the memory system 100, as discussed in more detail below. (While the word "token" will be used herein for simplicity, more generally, a "token" is an example of a variable credit value that indicates an amount of energy currently available.) The token bucket can be implemented in any suitable way. For example, in one embodiment, the token bucket 111 is implemented by dedicated hardware formed as part of the memory controller 102 (which may be an Application Specific Integrated Circuit, or ASIC), implemented through software or firmware in the memory controller 102, or implemented through a combination of hardware and software. In one arrangement, the token bucket 111 is implemented as a counter with firmware that initiates the counter to an initial value and maintains the value in the counter according to a token bucket scheme. In one embodiment, the token bucket 111 is implemented as an n-bit counter with a suitable routine to initialize the bucket and add tokens as appropriate and another routine to check the bucket prior to performing an operation and update the bucket 111 as energy is consumed.

The memory system 100 also includes an average power sensor 112 and power distribution circuits 113. The average power sensor 112 (which can be a hardware component) senses an average power drawn from a host power rail and supplied to the power distribution circuits 113. The power distribution circuits 113 distribute power to various components in the controller 102. The average power sensor 112 and the power distribution circuits 113 will be discussed in more detail below.

The memory system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
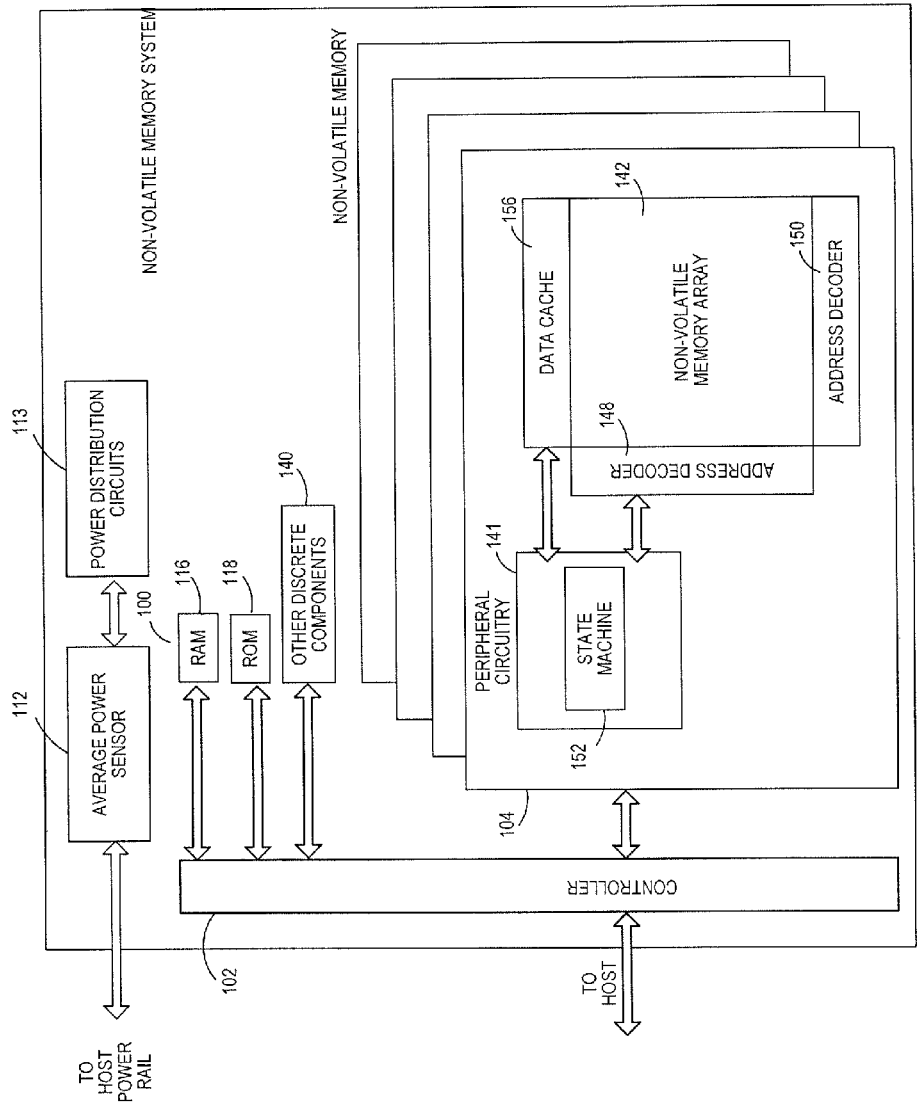
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As mentioned above, in one embodiment, the memory system 100 comprises a token bucket 111. The following paragraphs provide an overview of some exemplary operations of the token bucket 111.

The rate at which the memory system 100 uses energy is largely determined by the rate at which read, write, and erase operations are performed. The memory controller 102 manages these functions and thus determines the rate of energy use. While various mechanisms may be used to control energy use, in one embodiment, the memory system 100 uses a token bucket 111 in the memory controller 102 to perform such control. (As mentioned above, while the word "token" will be used herein for simplicity, more generally, a "token" is an example of a variable credit value that indicates an amount of energy currently available.) The token bucket 111 may be implemented by dedicated hardware formed as part of the memory controller 102 (which may be an Application Specific Integrated Circuit, or ASIC), implemented through software or firmware in the memory controller 102, or implemented through a combination of hardware and software. In one arrangement, the token bucket 111 is implemented as a counter with firmware that initiates the counter to an initial value and maintains the value in the counter according to a token bucket scheme.

Figure 3:
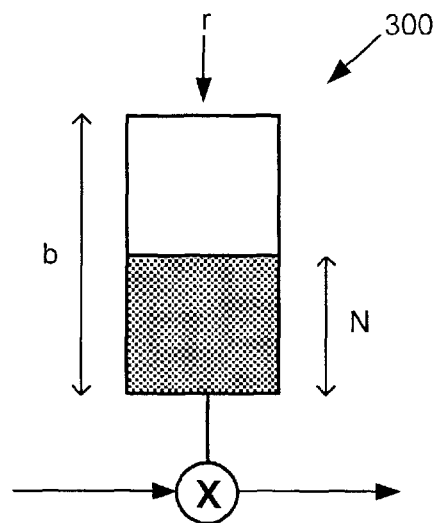
FIG. 3 is an illustration of a token bucket of an embodiment.

FIG. 3 illustrates the operation of a token bucket 111 of an embodiment. In this example, the operation of the token bucket 111 is analogous to a bucket that is filled to a particular level N at any given time (where N is the number of tokens in the bucket 111), the bucket 111 having a maximum capacity b (maximum number of tokens that bucket 111 can contain). Before a power-consuming operation is performed, the token bucket 111 is checked to see if enough tokens are available to perform the operation. Thus, when the host sends a write command and some data to be written, the memory controller 102 determines the individual write operations involved, and, for each write operation, the controller 102 checks the token bucket 111 before the data is written in the memory 104. In this way, operation of the memory system 100 may stay within specified limits.

Energy consumption limits may be set in a number of ways. The size of the token bucket b represents the largest amount of energy that may be consumed in a burst. In one example, where it is desirable to program four upper pages in parallel, and each page programming operation uses 5500 mJ/us, the maximum power is 22000 mJ/us, and b is selected accordingly. In one embodiment, any operation or combination of operations that would use more than b tokens is not possible in a given time period. Any such operation(s) are preferably carried out over more than one time period. Tokens are preferably added to the token bucket 111 to replace tokens that are removed as a result of power consumption. The rate at which such tokens are added represents the maximum average energy consumption. In FIG. 3, the rate at which tokens are added is represented by r. In general, r depends on the host interface standard. Tokens are added at a rate r, or one token is added every 1/r seconds. In some cases, it may not be possible or desirable to add one token every 1/r seconds (e.g., if the clock resolution is not sufficient). So, instead, a number of tokens can be added every S milliseconds, the number given by (r*S)/1000. If the token bucket 111 is already full (i.e., if N=b), then any tokens to be added to the bucket 111 are not added but are discarded (i.e., in one embodiment, the bucket 111 cannot hold more than b tokens). The token bucket 111 may be implemented as an n-bit counter with a suitable routine to initialize the bucket and add tokens as appropriate and another routine to check the bucket prior to performing an operation and update the bucket 111 as power is consumed.

Prior to performing a power-consuming operation, the number of tokens N in the token bucket 111 can be checked to make sure that there are enough tokens. If insufficient tokens are available, the operation may be stalled. For example, when a write operation is received that requires n tokens (where n is the amount of power times the duration of the operation (mW*uS)), the token bucket 111 can be checked to see if it contains at least n tokens. When a power-consuming operation is performed, the number of tokens in the token bucket 111 is reduced according to the energy consumed. Thus, for a write operation requiring n tokens, the number is reduced by n. Similarly, for an erase operation, the number may be reduced by an amount that represents the energy consumed in erasing a block or metablock (unit of erase). And for a read operation, the number may be reduced by an amount that represents the energy consumed in reading a page. In some cases, writing different pages may consume different amounts of energy (e.g., upper page write generally consumes more energy than lower page write).

The rate r may be determined as follows. Let a be the desired average power. Let b be the allowed energy burst size. Then set the rate r to be: r=a−(b/1 sec).

For example: Let a be 100 mW. Let b be four D3 upper page programming times (4×0.55 mJ)=2.2 mJ. Then set the rate r to be: r=100 mW−2.2 mJ/sec=97.8 mJ/sec.

Figure 4:
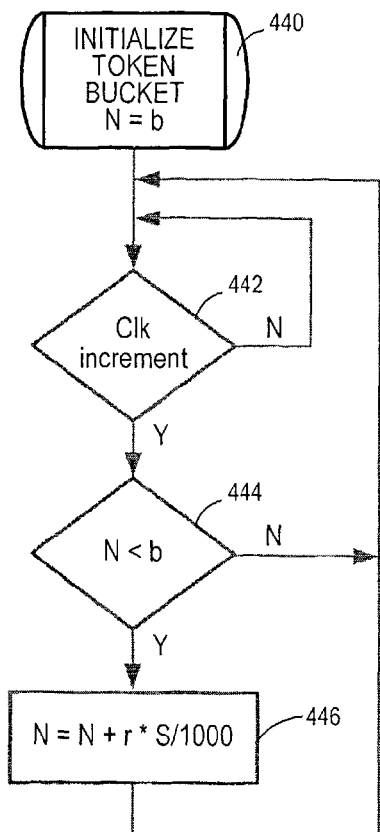
FIG. 4 is a flowchart of a method of an embodiment for adding tokens to a token bucket.

FIG. 4 shows a routine for initializing a token bucket 111 and adding tokens to the token bucket 111 during operation. The token bucket 111 is initialized (act 440) with the number of tokens in the bucket N set to the maximum number of tokens b. The routine then waits for a clock cycle (act 442) and checks to see if the token bucket 111 is full (if N=b) (act 444). If it is still full, then the routine returns to wait for the next clock cycle (act 442) without adding any tokens. If the token bucket 111 is not full, then the number of tokens in the token bucket 111 is increased by (r*S)/1000 (act 446). Then, the routine returns to wait for the next clock cycle (act 442). The routine of FIG. 4 may be implemented in firmware using an interrupt routine, or it may be provided as a timer/counter in hardware for high precision timing.

Figure 5:
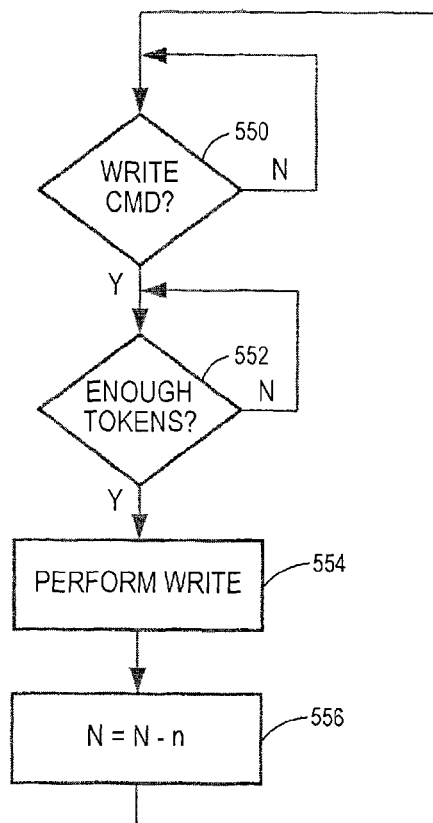
FIG. 5 is a flowchart of a method of an embodiment for using a token bucket with a memory write operation.

FIG. 5 shows a routine for performing write operations using a token bucket 111. The routine waits for a write command to be received from a host (act 550). Then, the routine checks to see if there are enough tokens in the token bucket 111 to carry out a write operation (act 552). If there are not enough tokens, the routine stalls until enough tokens are present in the token bucket 111 (more tokens are added at each clock cycle). Then, the write operation is performed (act 554). The number of tokens in the token bucket 111 is then reduced (act 556) by a number n that represents the energy consumed in the write operation. The routine then returns to wait for another write command (act 550). It should be noted that FIG. 5 shows the number of tokens being reduced (act 556) after the write is performed (act 554), but the order of these steps is not critical. The number of tokens may alternatively be updated before the write operation or during the write operation.

In addition to determining whether a particular write operation may be performed or not, a token bucket may also be used to determine a degree of parallelism to use in performing multiple operations. In various memory systems, operations can be performed sequentially or with some overlap that provides increased speed. However, such parallel operations may cause power consumption limits to be exceeded if they are not managed adequately. Aspects of these embodiments can be used for such management of parallel operations, so that power consumption limits are not exceeded. Also, it should be noted that while many of the above examples refer to write operations that are initiated by a host write command, these embodiments can be applied to other operations as well. Such operations may include write operations that are not directly initiated by a host write command, such as write operations that occur as part of garbage collection, or directory writes. Such operations may also include erase operations, read operations, and various operations performed within a memory controller such as ECC operations.

Figure 6:
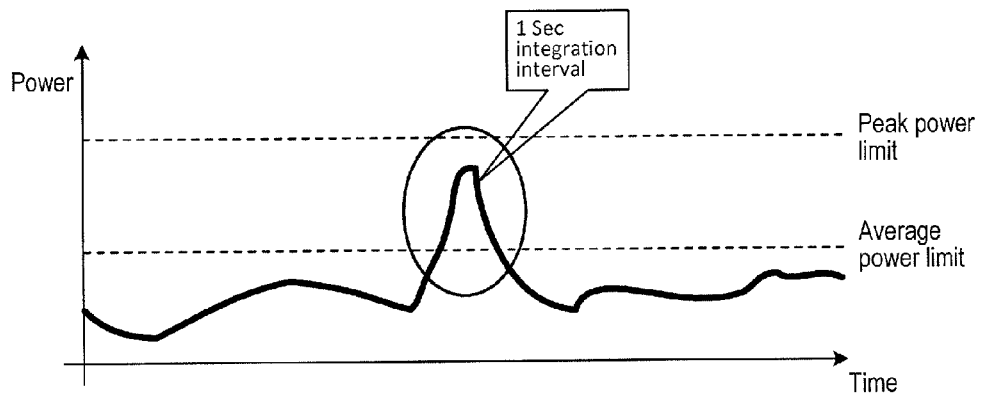
FIG. 6 is a graph showing power versus time for a memory system of an embodiment.

As mentioned above, before or after an operation is performed in the memory system 100, the number of energy tokens in the token bucket 111 is reduced by "n," which represents the number of energy tokens that the operation costs. "n" can be an estimate based on typical or worst case consumption. However, actual systems will often vary from the typical or worst case, so reducing the number of energy tokens by "n" may not represent the actual energy incurred by the memory system 100. Basing power management on worst case consumption is likely to result in underutilizing the available consumption limit of the memory system 100. However, basing power management on typical consumption bares the risk of exceeding the allowed consumption. A memory system may be required to maintain average consumption at a given window interval (e.g., a one-second rolling window). FIG. 6 shows the undesired situation of the memory system exceeding the average consumption limit. (The relevant metric here is average consumption. The total energy consumed in the averaging window is much higher than energy consumption of single memory operation.)

The following embodiments can be used to better optimize average power consumption management by better managing average power consumption to more fully utilize the available consumption limit. In general, these embodiments add actual consumption feedback to the energy token bucket concept discussed above. In this way, the value "n" can more accurately reflect the actual energy cost of a memory operation. With this addition, these embodiments can be used to minimize average consumption safety margins and power throttling, thus allowing a better performance. The following embodiments will be discussed in terms of a token bucket client/server infrastructure. However, it should be understood that other infrastructures can be used.

As discussed above, the token bucket 111 maintains an allowed average power consumption by granting energy tokens from the bucket 111. New energy tokens (units) are added to the token bucket 111 at a configured fill rate, which correlates to the allowed sustain power consumption. In one embodiment, the total bucket maximum capacity is the amount of energy allowed to be dissipated at a burst duration, which temporarily consumes more power than is allowed by the host. The token bucket 111 serves as a short term buffer. At times, the memory system 100 may draw more energy than the allowed sustain, and the token bucket 111 will trend towards the empty position. At other times, the memory system 100 may draw less energy than the allowed sustain, and the token bucket 111 will trend towards the full position.

The token bucket 111 fill process of this embodiment is similar to that shown and discussed above with respect to FIG. 4. However, the token bucket 111 empty process is different in this embodiment and is based on a sensed average power over an update cycle, rather than by an assumed typical or worst case consumption. As used herein, an "update cycle" is the period of time over which sensed average power is computed. In one embodiment, the update cycle is 10 ms, although other periods of time can be used. Further, as will be discussed in more detail below, in other embodiments, the update cycle duration is variable based on various conditions. The token bucket 111 empty process will now be discussed in more detail in conjunction with FIGS. 7 and 8.

Figure 7:
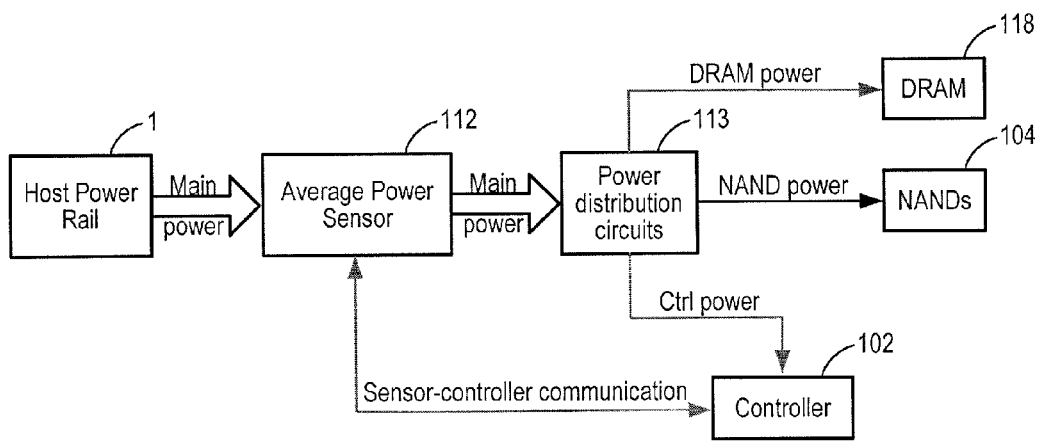
FIG. 7 is a block diagram of a memory system of an embodiment.

FIG. 7 is a block diagram showing a subset of the blocks discussed above with respect to FIGS. 2A and 2B. Specifically, FIG. 7 shows a power sensor 112 that senses average power as it passes from the host power rail 1 to power distribution circuits 113. The power distribution circuits 113 supply power to the DRAM 118, memory dies 104, and controller 102. Average power can be constantly sensed by the sensor 112 interposed between the host power rail 1 and the power distribution circuits. The controller 102 can communicate with the sensor 112 via a communication bus, and the controller 102 can read out power information. The token bucket emptying process will now be described.

Figure 8:
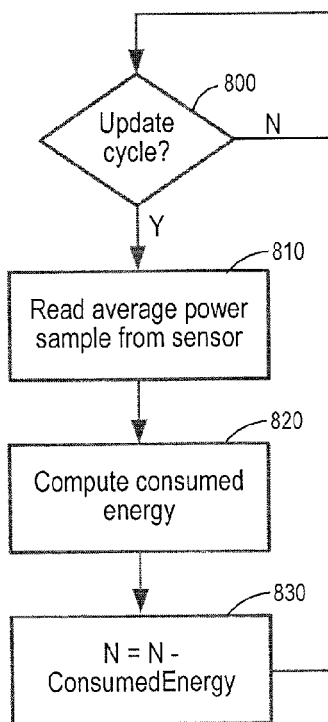
FIG. 8 is a flow chart of a method of an embodiment for emptying a token bucket.

As shown in the flow chart of FIG. 8, when the controller 102 is ready to update its cycle (before or after a memory operation is performed) (act 800), the controller 102 reads the average power sample from the sensor 112 (act 810). The controller 102 then computes the consumed energy of the memory system 100 (act 820). The consumed energy can be computed in any suitable way. For example, computed energy can be result of the following formula: [energy]= [update cycle duration]*[average power].

In another embodiment, the power sensor 112 can be replaced by a component that senses average current and average power. In this embodiment, the average power can be the result of the following formula: [average power]= [average current]*[average voltage]. And, computed energy can be the result of the following formula: [update cycle duration]*[average voltage]*[average current]. If said sensor supports only current sensing and does not support voltage sensing, then a nominal or maximum voltage (e.g., 5v or 5.5v) can be used. So, in computing average power, the memory system 100 can multiply measured average current with measured or assumed average voltage. Alternatively, power can be computed by $I^2R$, with R being the resistance value of the memory system 100.

Next, the controller 112 empties the token bucket 111 by subtracting the computed consumed energy from the amount of tokens ("N") in the token bucket 111 (act 830). In this way, the token bucket 111 maintains a variable credit value that indicates an amount of energy currently available for memory operations in the memory system 100. The variable credit value is determined by the difference between a maximum power limit for the memory system and consumed energy.

Figure 9:
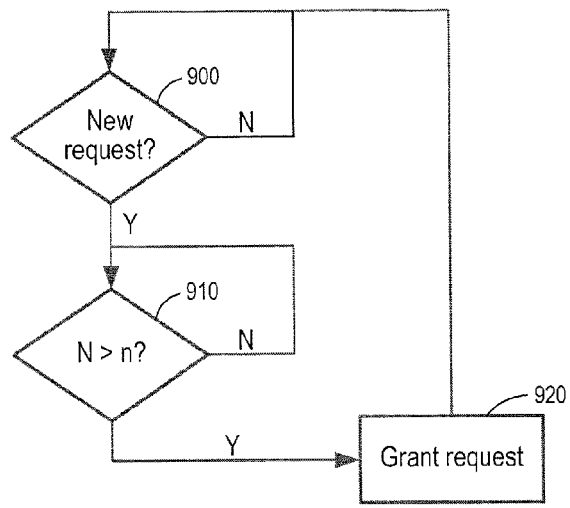
FIG. 9 is a flow chart of a method of an embodiment for granting a request to perform a memory operation.

As shown in FIG. 9, when the memory system 100 receives a request to perform a memory operation (act 900), the controller 102 determines if the token/variable credit value (N) is greater than a minimum value (n) (act 910). The controller 102 grants the request to perform the memory operation only if it is (act 920). Accordingly, if the total number of tokens in the token bucket 111 is below the minimum threshold, then the next memory operation is withheld. 'n' can be zero if energy requests are issued before an operation and may be a positive number when requests are being issued after the fact. In the latter case, 'n' can be chosen to be the total energy consumed by the different operations on credit basis.

There are many alternatives that can be used with these embodiments. For example, instead of the consumed energy being computed (e.g., using the sensor 112), the consumed energy can be measured. In this alternative, the exact number of tokens required to complete an operation is determined only at the end of the operation. While typical energy can be calculated by the following formula {[typical current] *[typical voltage]*[typical operation duration]}, a more accurate cost calculation can be possible if taking the actual operation statistics into account. The memory 104 can be equipped with duration, average voltage and average current sensing capabilities. The actual operation energy can be obtained from the memory 104 reporting the operation energy consumption. If the memory 104 can only sense average current and duration but cannot sense voltage, then the memory 104 can report operation charge (current*duration) back to the controller 102, and the controller 102 can compute operation energy by using the formula energy=charge*nominal voltage. The actual operation duration can be obtained from: (a) the memory 104 reporting the exact time it took for an operation, (b) the memory 104 reporting the number of programming loops and controller 102 multiplying this by a typical programming loop duration, or (c) the controller 102 timing the operation duration. The actual operation current can be reported by the memory 104, for example, if the memory 104 contains a measurement circuit that correlates current consumption.

Another alternative relates to the order of operations. In one embodiment, the actual operation token request is issued to the server after the fact, and the energy client can wait until this request is granted. In such case, the minimum token threshold is preferably positive. In an alternate embodiment, the energy client can issue a worst-case token request just before performing an operation and "payback" the token difference when the operation is done and the actual energy usage is known.

Another alternate embodiment relates to where the token bucket is implemented. In some of the above embodiments, the token bucket 111 was implemented in a controller 102 of a memory system 100 (see FIG. 1A). However, as shown in FIG. 1B, a plurality of memory systems 100 can be grouped together in a storage module 200. In this embodiment, it may be preferred to have the token bucket be implemented in the storage controller 202 that is positioned between the host and the storage module 200. The storage controller 202 would be in a better position to manage power of the entire storage module 200, as individual memory system controllers 102 would not know what power-consuming operations the other memory system controllers 102 are performing. Having the storage controller 202 implement the token bucket would help avoid the situation where each of the memory systems 100 uses power within its own internal limits, but the simultaneous use of the memory systems 100 causes the entire storage module 200 to exceed its power limit. Of course, other levels of granularity can be used as well.

Also, although the storage controller 202 would be aware of any host-initiated operations and can adjust the token bucket accordingly, it is possible that individual memory system controllers 102 may be performing internal memory management operations that may be consuming power as well. Accordingly, it may be preferred that the storage controller 202 communicate with the individual memory system controllers 102 to learn of such internal operations and adjust the token bucket accordingly for the power consumed by those internal operations. It may also be preferred to use a shorter update cycle for the token bucket in this embodiment to help ensure that the storage controller 202 is timely informed of the power usage of the individual memory systems 100.

Figure 10:
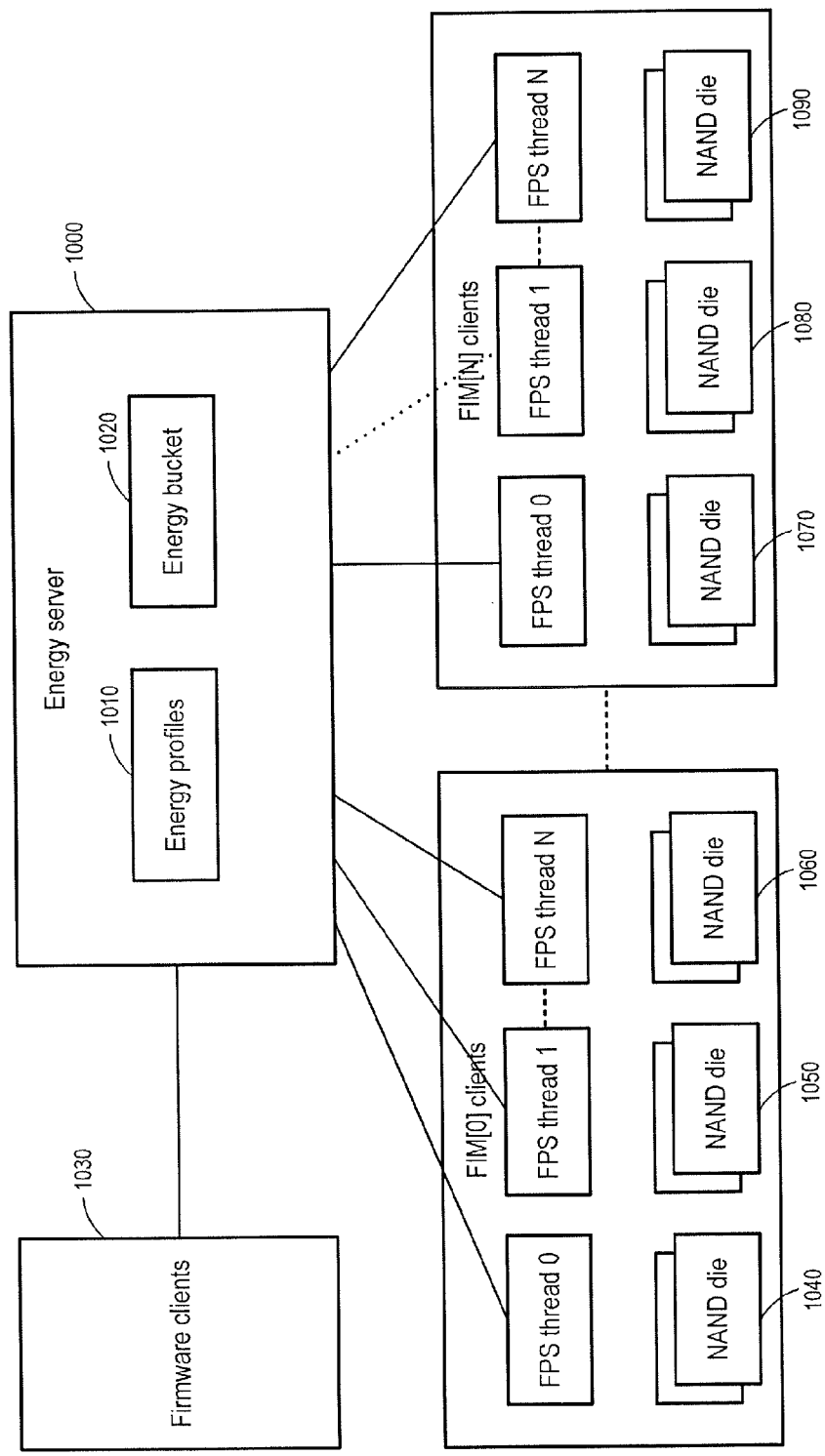
FIG. 10 is a diagram of an energy server-client architecture of an embodiment.

As mentioned above, in one embodiment, the token bucket concept is implemented as a client/server infrastructure. FIG. 10 is an example of one such implementation (of course, other implementations are possible). As shown in FIG. 10, an energy server 1000 is used to store energy profiles 1110 and an energy bucket 1020 (which can take the form of the token bucket discussed above). The energy server 1000 is in communication with firmware clients 1030 and a plurality of flash interface modules clients (FIM[0] clients to FIM[N] clients). Each FIM client comprises 0-N flash protocol sequence (FPS) threads, each being associated with a plurality of memory dies 1040-1090.

In one embodiment, a hardware/firmware-based power allocation system is used to accelerate the way power is dynamically allocated and managed across memory systems. In general, a centralized server and distributed client system can be used to maintain a power budget. The power server maintains a maximum power consumption to be within required limits. The server grants power usage to the client. Power may be allocated according to preset priority, and it is possible to assign clients with a priority level (e.g., so that the highest priority client will always be served first). Among equal priority clients, power can be allocated according to a first-in-first-out method, for example.

In this embodiment, some clients are designated as "power clients." The client requests should preferably be posted at a time as close as possible to the actual operation being performed to help ensure the maximum power management is accurate and that the power budget is fully utilized. The controller 102 can include a buffer manager (DRAM module 116) as a client. When an ECC module, such as LDPC, is used, the module can consume substantial power. The power request can result in staggering the LDPC engines' operation in case multiple engines are operating simultaneously.

Typically, dominant power and energy are consumed by memory devices performing an operation (e.g., a NAND program operation). The NAND interface, especially in a configuration with many die loading and high speed (e.g., 16-die loading and/or fast toggle mode 400), is power hungry. Thus, backend clients are preferably located in the flash sequencer. In cases where the frontend interface (e.g. NVMe over PCIe) can be placed in several power states (e.g., high and low power), the frontend may be a power client as well.

Regarding the timing of a client power request, the flash sequencer can issue a request for power just before executing the requested operation and waiting for grant. In case grant is not being provided due to insufficient power resources in the system, the client may be stalled waiting. As such, power requests can be issued by the client with a timeout value. The timeout can be set to span the entire operation duration plus or minus an optional margin. Operations such as NAND bus data transfer can be very accurate; therefore, the payback method can be based solely on the timeout mechanism. Nevertheless, if the flash sequencer thread is active, the client-payback can be used as well.

Other operations can be issued for lengthy operations (i.e., a NAND program operation) that may be subject to large variance between worst case timing to typical case. Basing the power payback mechanism on a timeout may result in suboptimal performance when throttled. Therefore, especially for program operations, it may be preferred to consider the client, so as to payback the power accurately to the power server if possible.

Power timeouts can be set to a value that is a worst-case condition. Nevertheless, the power consumption can typically be shorter than the timeout duration. Relying on timeouts alone can lead to a situation in which the SSD underutilizes its power budget. Thus, the client-payback method may be preferred when possible. There are, however, cases when timeout payback is helpful (e.g., when a flash sequencer thread is occupying the NAND interface and, by that, is preventing a status check and is following client-payback by another thread). If the timeout expires before the flash channel thread has a chance to client-payback, the timeout mechanism may benefit the system with an early power check in. Each client can be assigned a set priority that is initialized by firmware and can be modified in run time. The backend client may be assigned low priority.

Turning now to the power server, the purpose of the power tokens request is to limit the maximum power consumption. Violating such requirements may result in a voltage drop and negative host effects. Therefore, it is preferred that the memory system power limit be maintained at all times. Firmware can initialize the server to the number of total available power tokens.

The memory system 100 can have several power rails, each with its own dedicated power regulator. The power regulator cost can correlate to its current rating. Limiting power on a specific power rail limits the power circuit cost. The power server can support multiple "mini-buckets" (e.g., two) for that purpose (e.g., the NAND core 3.3v rail mini-bucket and NAND interface 1.8v rail mini-bucket). The mini-bucket can fill and empty together with the total bucket, and its use is to support the process of granting a request based on localized power usage. Each request profile can include information regarding mini-bucket classification, and there may be several options (e.g., no mini-bucket, NAND core mini-bucket, or NAND interface mini-bucket).

Figure 11:
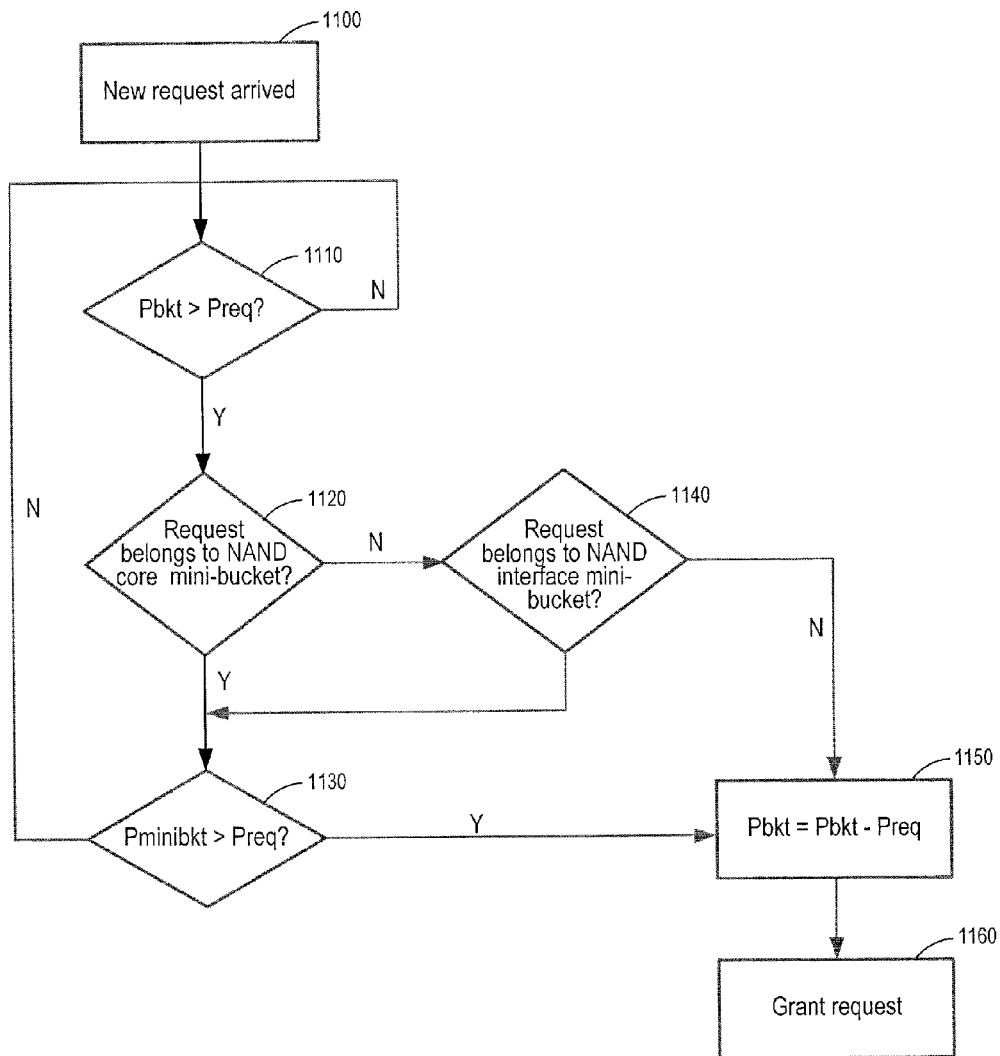
FIG. 11 is a flow chart of a power grant process of an embodiment.

Clients can asynchronously request power from the server as illustrated in the FIG. 11. In this figure, "Pbkt" denotes tokens available in the power server, and "Preq" denotes requested tokens. As shown in FIG. 11, when a new request arrives to the power server (act 1100), the server check the amount of tokens requested versus the amount of tokens available in the power bucket (act 1010). If a sufficient amount of tokens is available in the power bucket, the controller 102 determines if the request belongs to the NAND core mini-bucket (act 1120). If it doesn't, the controller 102 determines if the request belongs to the NAND interface mini-bucket (act 1140). If it doesn't (or if the number of tokens in the NAND core mini-bucket is greater than the requested number of tokens, the controller 104 subtracts the requested number of tokens from the bucket (act 1150) and grants the request (act 1160).

In this embodiment, the server decrements the amount of tokens from the power bucket upon granting a power request. Also, the power request can specify the expected maximum power that the following operation could consume. This is to minimize or eliminate the probability of several modules' maximum powers aligning and resulting in a maximum current that exceeds the limit.

Also, in this embodiment, the power bucket gets filled when a power consuming operation has ended. In principal, it is desired that the power will be de-allocated exactly when the operation ends. In practice, it is challenging for the server to know exactly when the operation practically ended.

Figure 12:
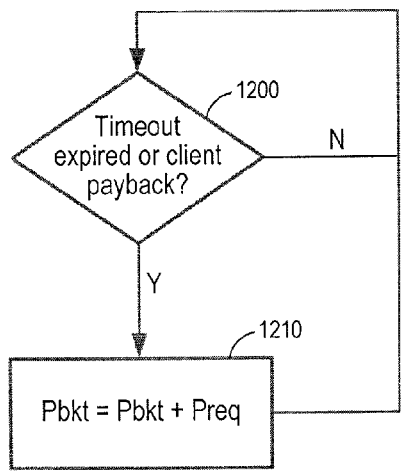
FIG. 12 is a flow chart of a power bucket filling process of an embodiment.

Two possible methods that can be used to address this are a client-payback mechanism and a timeout mechanism. A client can use the timeout mechanism, the client-payback mechanism, or a combination of both. As shown in FIG. 12, in the power bucket filling process, the controller 102 determines whether the timeout has expired or if the client needs to payback (act 1200). If either is true, the controller 102 adds the requested power tokens to the power bucket.

In this embodiment, the server keeps track of all current power allocations and relevant timers, so that the correct amount of tokens will be added upon timeout expiration or client payback. The request profile can include a defined timeout. Once the power request has been granted and the operation starts, power tokens can be decremented from the power bucket for a specified duration. As soon as the timeout expires, these tokens can be incremented into the power bucket. Also, the power client may have knowledge when an operation has ended. The power client may write to a designated register indicating operation completion. When a client-payback event happens, the operation power tokens can be incremented into the power bucket. Both filling methods may be used in combination. An example for combination of timeout and payback is when a worst case timing is set as a timeout value. If the client has knowledge of operation completion prior to the timeout expiration, then it may indicate completion, and the power would be paid back to the system at a timing better than the worst case. When a combination is used, the power server can be paid-back as soon as the first indication occurs (either timeout or end of operation) and can ignore the second indication associated with the specific operation, if such occurs. The client may use a different payback mechanism per different operation. For example, the backend client may use only timeout for data transfer to NAND while using a combination of timeout and client-payback can be used for NAND program operations.

A client can set an operation start bit to notify the power sever of the exact timing of the power consumption. The power server starts counting the timeout period once a client has set the operation start bit. A client can set an operation end bit to notify the power server of the exact timing for ending the power consumption. Setting the operation end bit indicates the client-payback.

Also, multiple power requests issued by same flash channel, same flash sequencer thread, and referencing same NAND die can be linked. When two power requests are linked, they form a two-node request pair constituting header and trailer requests. Note that it is possible that a trailer request [N] will become a header if a later request [M] is linked to request [N]. The power server is preferably required to maintain only two node-linked power requests. The flash sequencer preferably indicates to the power server if a power request is to be (a) independent request, (b) a header request, (c) a trailer request, or (d) both header and trailer requests.

If a request is indicated to be both header and trailer, it means that this request [M] acts as a trailer and is linked to a previous request [N], which acts as a header. At some point, request [N] expires (e.g., either because of timeout or client-payback). At a later point, request [O] is issued to be a trailer. At that point, request [M] acts as a header and is linked to request [O], which acts as trailer. Independent unlinked requests may be issued at any time before, during, or after issuing linked requests. Also, each node in linked request pair preferably requests the same amount of power tokens; however, each node may request different timeout values and/or energy tokens. The linked requests may be issued for different operation types but preferably have the same operation ID (operation ID can be constituted by the flash channel, thread, and die information). A linked request is preferably granted by the power server following the normal arbitration process of first-in-first-out. The request preferably waits until all former requests have been granted by the server. The power server preferably executes a trailer request as soon as the relevant header request has expired.

Some operations have deterministic power consumption attributes. For example, the first few peaks of a programming operation may occur at same offset each time the command is issued. Therefore, it is beneficial to stagger issuance of similar operations in time to prevent peak current alignment. On the other hand, the system may be tolerant to a few operations being issued simultaneously. To accommodate these considerations, the stagger engine can delay a client request from being evaluated by the server. The delay can be between operations within the same stagger bank by a stagger delay. Stagger bank and stagger delay are both defined in the operation profile. In one embodiment, there are up to 16 different stagger banks, and each operation may be assigned only to one bank (of course, other configurations are possible). For example, different program operations (e.g., lower, middle, upper, etc.) may be assigned to one bank. The stagger delay defines the minimum duration that the stagger engine needs to wait between previous bank operation grant and next bank operation evaluation. Subsequent client requests may arrive to the server while a request is being delayed by the stagger engine. On such event, the stagger engine can allow these requests to be evaluated and granted in order of arrival until the stagger delay has elapsed, and the delayed request will be evaluated by the server. This mechanism assures that a delayed request will not stall the entire system.

In order to simplify the flash sequencer client implementation and in order to avoid performance impact, the flash sequencer client can be designed to perform no math or complex operations. The flash sequencer client can instead request an operation profile indexed by operation type. The server can maintain a look up table in which an operation type is mapped to an amount of power tokens and a power server-payback expiration timeout. The profile look up table can be initialized by the firmware and may be modified during operation to update for adjustments in module power consumption, which may result from changing mode of operation (e.g., reducing clock frequency) or other effects (e.g. aging effects). In one embodiment, the power minibucket association information is included in the request profile, and the stagger class information is included in the request profile.

The power values can be populated by firmware. The values are preferably accurate enough in order to fully utilize the allowed power budget. Values too low can result in exceeding the power envelope, while values too high can result in reduced performance results when power is throttled. The firmware can read the profile values from the file system to populate the server and can suspend the server prior to populating the profiles. The server can withhold multiple client requests due to insufficient power and keep them pending at the server. Upon power availability, the server can grant the pending requests on a priority based on a first-in-first-out manner with no re-ordering of equal priority requests. The server first grants the highest priority requests based on a first-in-first-out manner, followed by the lower priority requests and so on. Generally, low priority clients may reach starvation. The probability for the server to receive multiple requests at the same time (i.e., same clock cycle) may be low, but it may happen. The arbitration method may have a negligible effect on performance. In such event, the server can arbitrate by a simple round robin.

Figure 13:
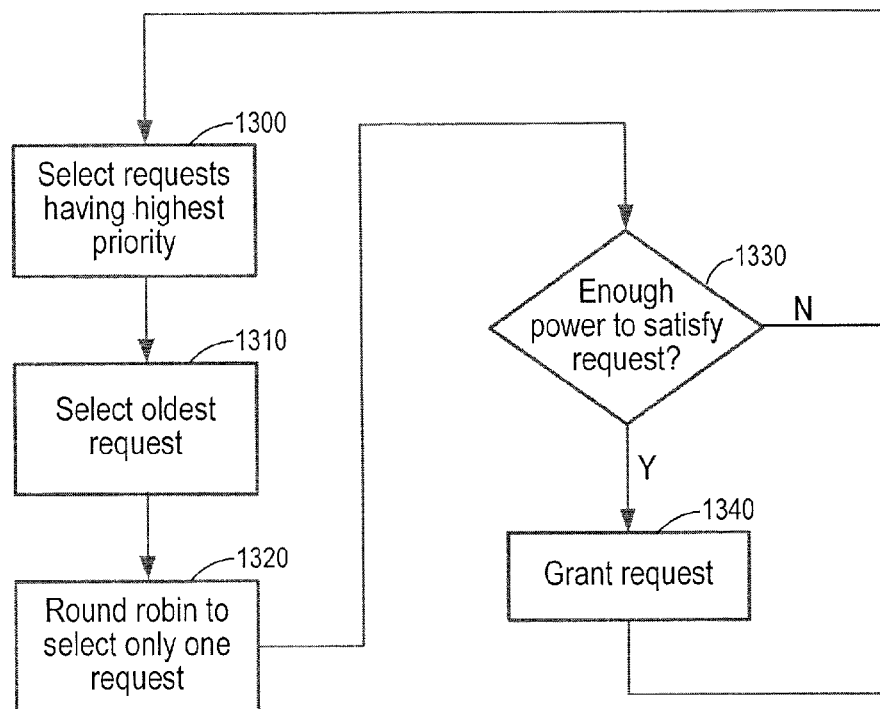
FIG. 13 is a flow chart of an arbitration flow of an embodiment.

FIG. 13 is a flowchart of an arbitration method of an embodiment. As shown in FIG. 13, the controller 102 first selects requests with the highest priority (act 1300) and then selects the oldest of those requests (act 1310). The controller 102 then uses a round-robin process to select only one request (act 1320). The controller 102 checks to see if there is enough power to satisfy the request (act 1330), and, if there is, the controller 102 grants the request (act 1340).

As described above, the token bucket fill rate is preferably lower than the allowed average power consumption because the sustained state preferably "compensates" for a momentary power burst. In some approaches, the energy bucket maximum size is fixed to be the peak power limit. As the bucket allows "energy bursts," the bucket fill rate is lower than the average power allowed by the memory system to be consumed. In some circumstances, the penalty can be suboptimal power usage under a maximum performance sustain workload. The following embodiments can be used to better optimize an energy bucket power management approach to maximize memory system performance per system workload. This can help optimize power allowed to the fullest extent. In cases where power is throttled, power saving is translated to performance increase.

Several different configuration pairs of energy bucket fill rate and bucket capacity can result in same memory system maximum long duration average power consumption. For example, a longer power burst coupled with lower sustain power consumption can yield the same average power as a shorter power burst coupled with a higher-allowed sustain power consumption. However, there may be a difference between the above-mentioned setting points. A longer power burst coupled with lower sustain power could match a bursty host workload where the host issues concurrent multiple requests followed by a lower activity period (or even idle period). Such behavior may be a typical usage case for typical user (e.g., web browsing). On the other hand, higher allowed sustain power coupled with shorter power bursts could better fit a sustain performance benchmark or different user workloads (e.g., HD video playback).

In order to adaptively optimize for the different actual host workloads, it is preferred to track and adjust the energy server parameters on the fly as a response to the changing host workload. The memory system 100 can maintain a set of N (e.g., 5) different energy bucket configurations. These configurations can be kept in a look up table that is stored in the file system. FIG. 14 is an example of such a table. The bucket capacity and bucket fill rate columns can be maintained while the other columns can be informative.

In one embodiment, a dynamic optimal energy bucket setting ("DOES" algorithm is used. A simple and sufficient indicator to the DOES algorithm is the average energy bucket fullness state. Preferably, the average fullness would be at 50% level at all times. Average fullness at almost full is indicative of a workload attributed by long periods in which the memory system 100 consumes less than the allowed sustain power, thus allowing the energy bucket to fill up beyond the 50% level. At such host workloads, the host system can benefit from increased power bursts (i.e., higher burst performance) at the expense of a lower sustain power consumption limit (i.e., reduced sustain performance). Conversely, average fullness at almost empty is indicative of a memory system 100 that does not manage to fill the energy bucket before a next burst is required (e.g., host burst is followed by only a short period of reduced activity) or, alternatively, of a memory system that consumes energy on an ongoing basis and not at power burst patterns (e.g., during a long sequential benchmark).

Average fullness can be maintained by the energy token bucket system. The firmware can periodically read the average fullness and compose more complex (or more accurate) statistics based on the readings. An alternative workload indicator is for the host to inform the memory system 100 what the proper workload should be. Some host hinting structure may already be supporting a set of hints that may infer different upcoming access patterns.

In one embodiment, the algorithm for memory system identification of different workloads is implemented using a feedback loop that compares a fullness metric (based on the average energy bucket fullness) to a 50% set point. The algorithm outputs are the bucket new fill rate and maximum capacity. The metric can be composed of weighted proportional, integral, and derivative components. Adjusting the energy bucket parameters is expected to be a slow process; therefore, this control loop is preferably implemented in firmware.

Figure 15:
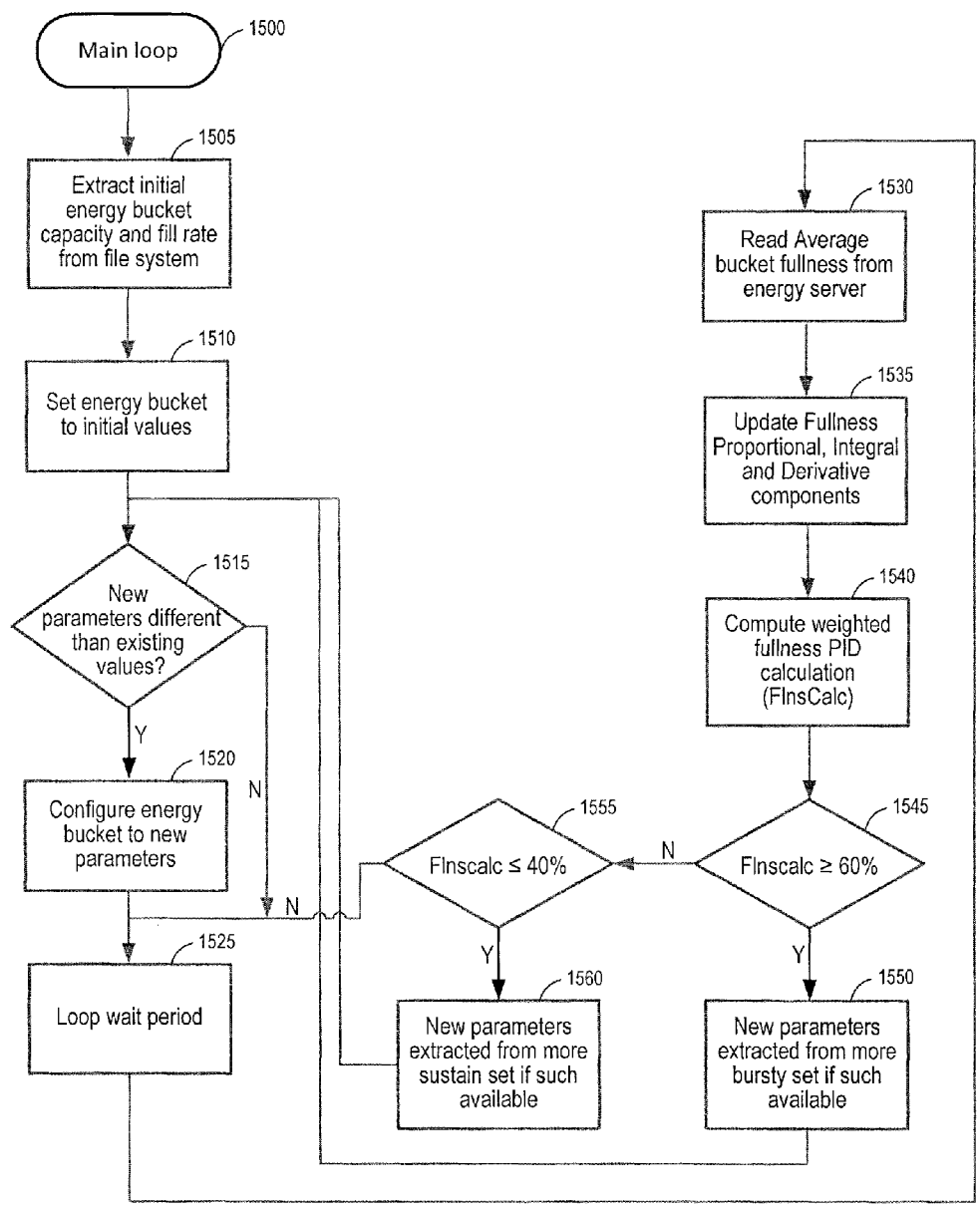
FIG. 15 is a flow chart of a dynamic optimal energy settings method of an embodiment.

FIG. 15 is a flow chart of the algorithm of an embodiment. The loop cycle duration can be slow, and the firmware can to read the fullness status at a faster rate to gather more accurate statistics. As shown in FIG. 15, in one embodiment, the controller 102 begins a main loop (act 1500), in which the controller 102 extracts the initial energy bucket capacity and fill rate from the file system (act 1505). The controller 102 then sets the energy bucket to the initial values (act 1510) and determines if new parameters are different than the existing values (act 1515). If they are, the controller 102 configures the energy bucket to the new parameters (act 1520) and waits for a loop wait period (act 1525).

The controller 102 then reads the average bucket fullness from the energy server (act 1520). Next, the controller 102 updates the fullness proportional, integral, and derivative components (act 1525) and computes the waited fullness PID calculation (FinsCalc) (act 1540). If FinsCalc is greater than or equal to 60% (act 1545), the controller 102 extracts the new parameters from a more bursty set, if available (act 1550). If FinsCalc is less than or equal to 40% (act 1545), the controller 102 extracts new parameters from a more sustained set, if available (act 1560). In an alternate embodiment, the host can send a hint to the memory system 100 about upcoming workload, which may be simpler, as it does not require data gathering and projection.

As mentioned above, there are several alternatives that can be used with these embodiments. One such alternative relates to the granularity in which power tokens are counted. As discussed above, power can be managed using a token-based system. In one embodiment, a fixed budget of power tokens over time is determined for each thermal and power mode. Read or write commands are translated into a number of power tokens based on the cost of the NAND operations comprising it. As an operation is initiated, the cost of the operation is deducted from the token budget. When the operation concludes, the tokens are returned to the budget. An operation is paused when there are no available power tokens.

Figure 16:
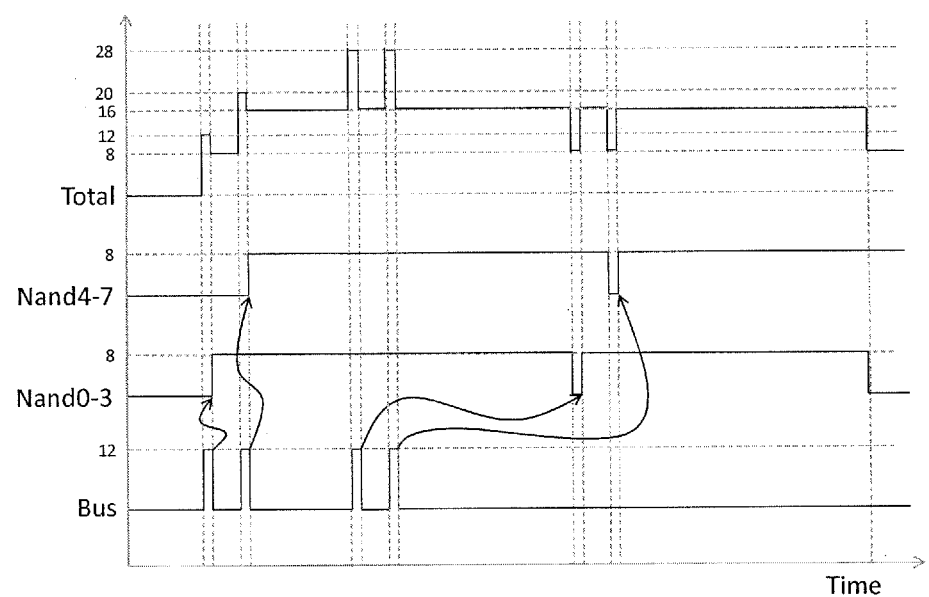
FIG. 16 is a graph of power tokens used versus time of an embodiment.

FIG. 16 is a graph that illustrates these features. In general, each read and write command between the controller 102 and the memory dies is allocated a certain energy cost, which is managed by a budget that is increased or decreased based on the power requirements of the memory device. When the budget is exceeded, the controller 102 delays further operations until tokens are released back into the budget.

In certain situations, the power management algorithm presented above may result in having some operations be double counted or estimated with too high a token cost since they were counted as logic operations without a breakdown to the performed hardware operations. This is because a single read or write operation was considered as a fixed cost, without taking into account other activities on the same bus. To provide a more-optimal situation, operations performed by the same set of memory dies can be coalesced, in which case the token cost for each coalesced operation may be lower. The power token calculation can be improved by determining an actual cost per hardware resource used in contrast to an aggregated logical cost of the operation (such as program, erase, etc.).

Accordingly, multiple operations performed concurrently within the same die group may be coalesced to the same power token cost, and multiple transfers to the same die group while a NAND operation is occurring may be coalesced to the same transfer power token cost. For example, transfer and program operations have a single token cost taken into account without knowledge if the operation already started, already finished, or is currently being executed, per channel/die. Hence, if another transfer and program operation is started in parallel in the same channel and programming is ongoing, the token cost of the transfer may be reduced from the overall calculation since the resource is already consuming the same power allocation and cannot consume more power.

FIG. 17 will be used to illustrate this concept. FIG. 17 is a chart showing the token cost associated with a program transfer, a NAND program, a read transfer, and a NAND sense. A single write operation when the die is otherwise idle would cost p+n. A new write operation when the die group is already writing another transaction would cost p. A new write operation when the channel group is already transferring another write operation would cost n. A new write operation while the channel group is already transferring a different write operation and the die group is already writing a different transaction would have a cost of 0, as both resources are already committed. However the cost would be maintained until the last operation frees its resources. Regarding reads, a single read operation when otherwise idle would cost r+s. A new read operation when the die group is already sensing another read would cost r. A new read operation when the channel group is already transferring another read would cost s. A new read operation while all resources are already in use will not have additional incremental cost, but the existing resource cost will be maintained until the final read completes. Merged operations and tokens can be taken into account. For example, some operations are to operate on the same set of dies at the same time, in which case the token cost for each operation is lower, as illustrated above. Random operations have a much lower cost than sequential operations and, as such, do not get allocated power tokens.

By separating out the individual components of a transaction, more accurate power token accounting can be performed, thus reducing the cost of multiple simultaneous operations and allowing higher performance using the same power accounting. This is because using a fixed cost for each write and read operation may not be efficient when sub-operations can be combined, and the combined cost is not the same as the cost of each individual discrete sub-operation. For example, if two read operations use the same resources, the shared resources can be counted only once and not twice, even though two different read operations are taking place. By separating out components in each operation, if the same resource is being used for multiple operation at the same time, that resource is counted once instead of twice.

For example, say a data transfer is taking place over a group of channels, and two writes are occurring on the same group of channels. The two writes are using the same group of channels, just for a longer time. So, under this embodiment, the resource would only be counted once (but for a longer period of time), instead of twice. As such, the aggregate cost is the cost of one transfer from the duration of both transfers plus the cost of all the program operations. Again, with this embodiment, commands are divided into the resources that they use, and, if a shared resource is used, the cost of that resource is extended instead of creating an additional power token cost for it.

FIGS. 18-22 will now be discussed to illustrate one exemplary embodiment. It should be understood that this is just one example, and other implementations can be used. Accordingly, the details of this implementation should not be read into the claims unless expressly recited therein.

Figure 18:
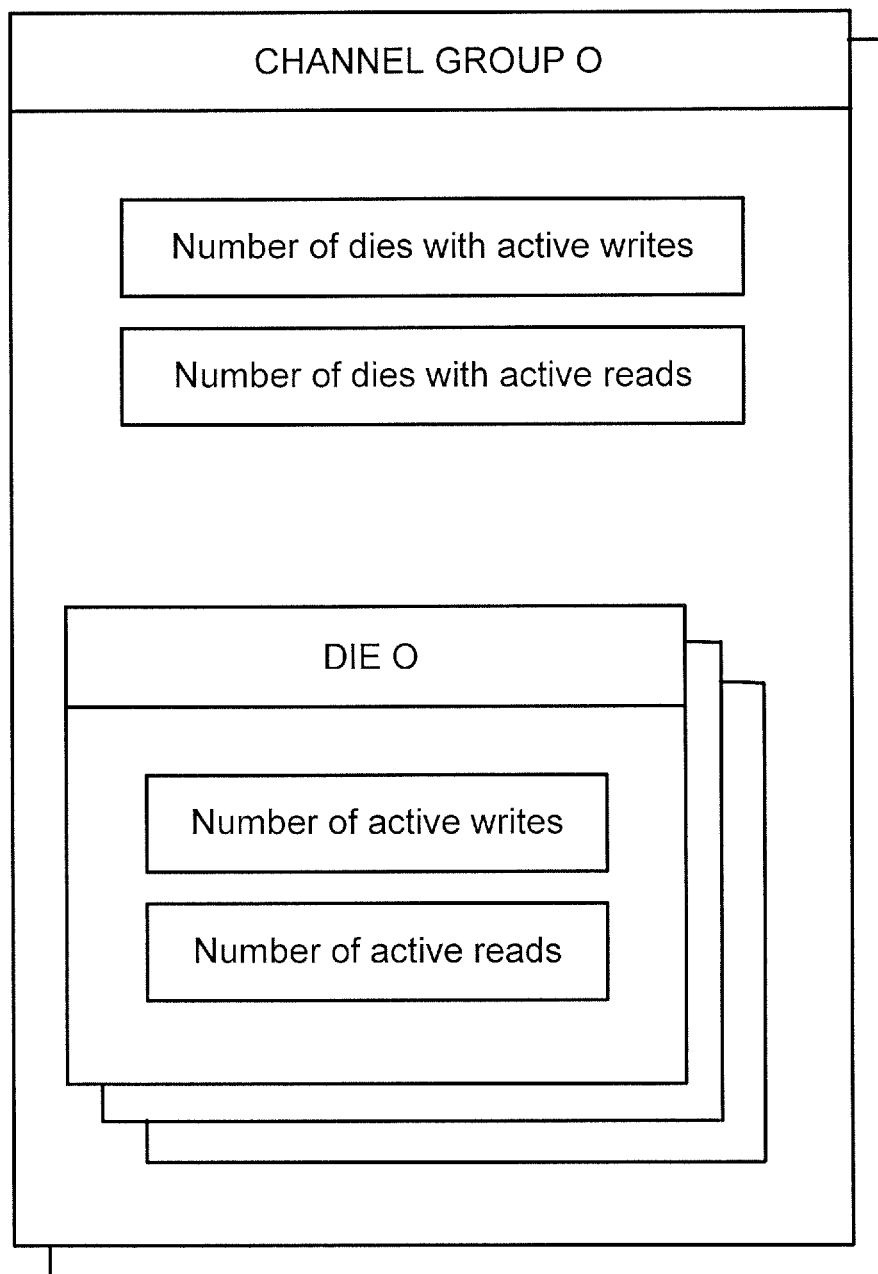
FIG. 18 is a diagram of a data structure of an embodiment.

In this embodiment, a data structure (e.g., a database managed by the controller 102) is used to track sub-operations. FIG. 18 is a diagram of a data structure of an embodiment. As shown in FIG. 18, this data structure tracks the number of dies with active writes and the number of dies with active reads for each channel group. (As used herein, a channel group is a set of one or more channels between the controller 102 and the memory dies.) This data structure also tracks the number of active writes and the number of active reads for each memory die.

Figure 19:
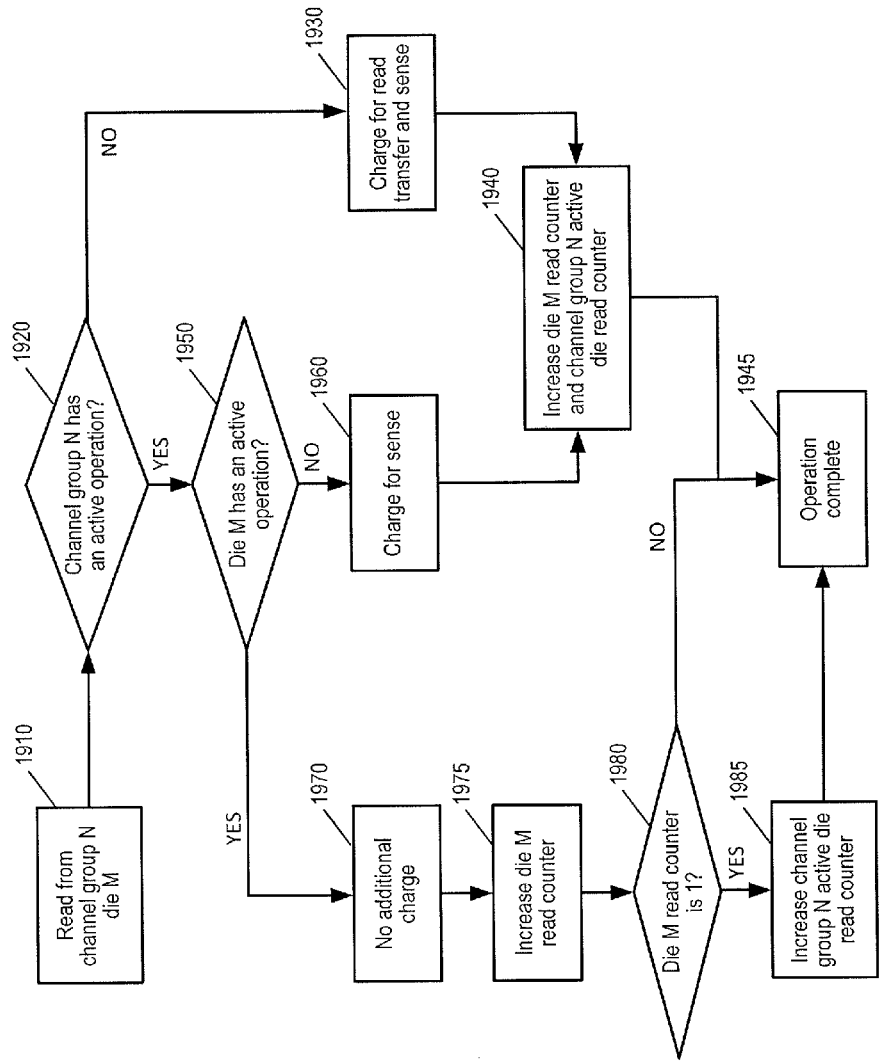
FIG. 19 is a flow chart of a read-acquire-token process of an embodiment.

FIG. 19 is a flow chart of a read-acquire-token process of an embodiment. As shown in FIG. 19, the controller 102 first reads die M from channel group N (act 1910). The controller 102 then determines if channel group N has an active operation (act 1920). If it does not, the controller 102 charges the budget for the read transfer and sense (act 1930). The controller 102 then increases the die M read counter and channel group N active die read counter (act 1940). If the controller 102 determines that channel group N does have an active operation, the controller 102 determines if die M has an active operation (act 1950). If it does not, the controller 102 charges the budget for the sense (act 1960) and then increases the die M read counter and channel group N active die read counter (act 1940). If the controller 102 determines that channel group N does have an active operation, the controller 102 makes no additional charge to the budget (act 1970). The controller 102 then increases the die M counter (act 1975). If the die M counter is 1 (i.e., there were no active reads beforehand), the controller 102 increases the channel group N active die counter (act 1985). If the die M counter is not 1, the operation is complete (act 1945).

Figure 20:
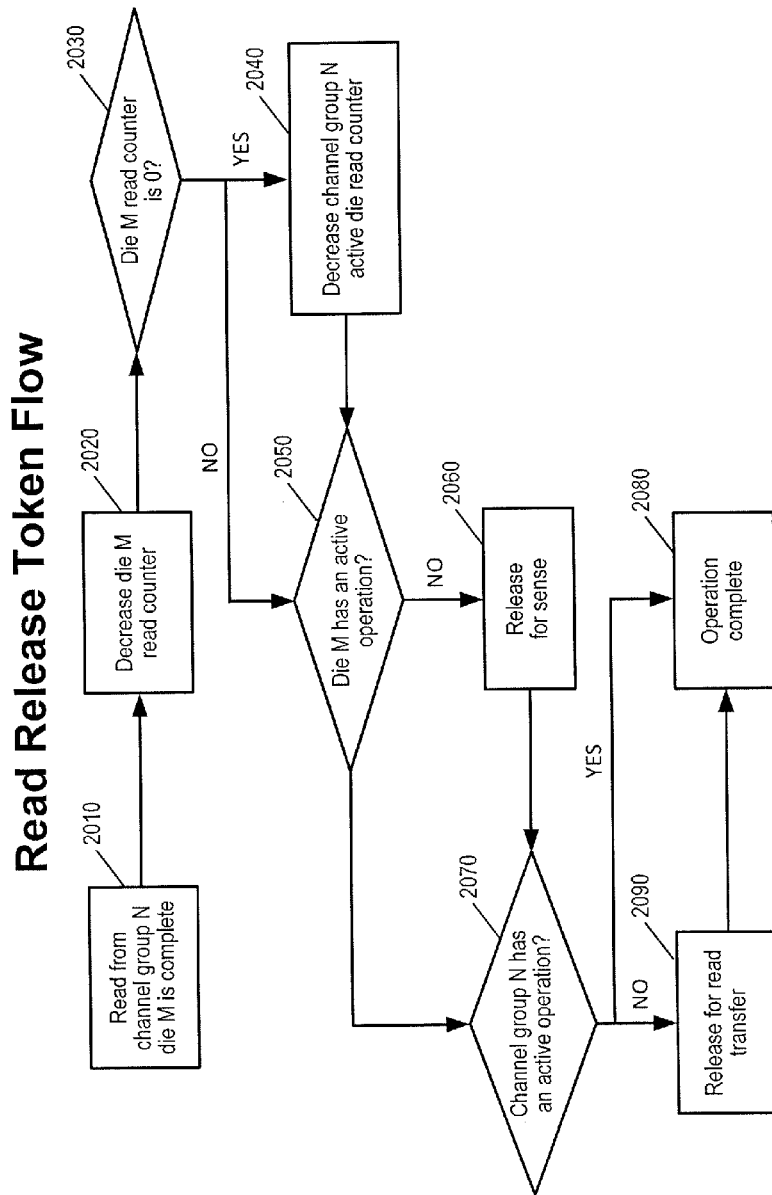
FIG. 20 is a flow chart of a read-release-token process of an embodiment.

FIG. 20 is a flow chart of a read-release-token process of an embodiment. As shown in FIG. 20, the controller 102 first reads from channel group N that die M is complete (act 2010). Next, the controller 102 decreases the die M read counter (act 2020) and determines if the die M read counter is 0 (act 2030). If it is, the controller 102 decreases the channel group N active die read counter (act 2040). Otherwise, the controller 102 determines if die M has an active operation (act 2050). If it does not, the controller 102 releases the tokens for sense (act 2060). If it does, the controller 102 determines if channel group N has an active operation (act 2070). If it does not, the controller 102 releases the tokens for read transfer (act 2090). If it does, the operation is complete (act 2080).

Figure 21:
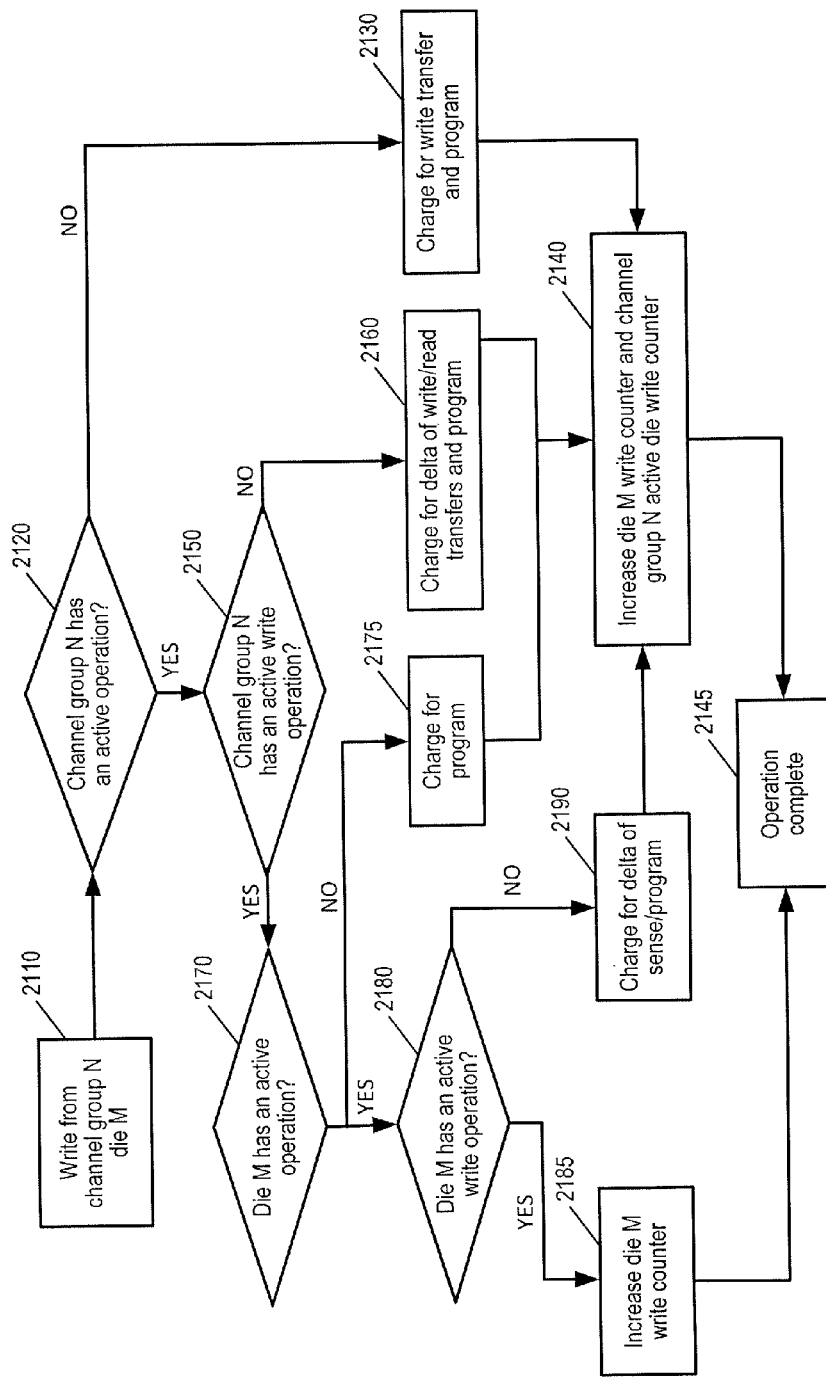
FIG. 21 is a flow chart of a write-acquire-token process of an embodiment.

FIG. 21 is a flow chart of a write-acquire-token process of an embodiment. As shown in FIG. 21, the controller 102 writes to die M from channel group N (act 2110). The controller 102 determines if channel group N has an active operation (act 2120). If it does not, the controller 102 charges the budget for the write transfer and program (act 2130) and increases the die M write counter and channel group N active die write counter (act 2140). If channel group N does has an active operation, the controller 102 determines if channel group N has an active write operation (act 2150). If it does not, the controller 102 charges the budget for the delta of write/read transfers and program (act 2160) and increases the die M write counter and channel group N active die write counter (act 2140). If channel group N does have an active write operation, the controller 102 determines if die M has an active operation (act 2170). If does not, the controller 102 charges the budget for the program (act 2175) and increases the die M write counter and channel group N active die write counter (act 2140). If die M has an active operation, the controller 102 determines if die M has an active write operation (act 2180). If does not, the controller 102 charges the budget for the delta of sense/program (act 2190) and increases the die M write counter and channel group N active die write counter (act 2140). If die M does have an active write operation, the controller 102 increases the die M write counter (act 2185) and the operation is complete (act 2145).

Figure 22:
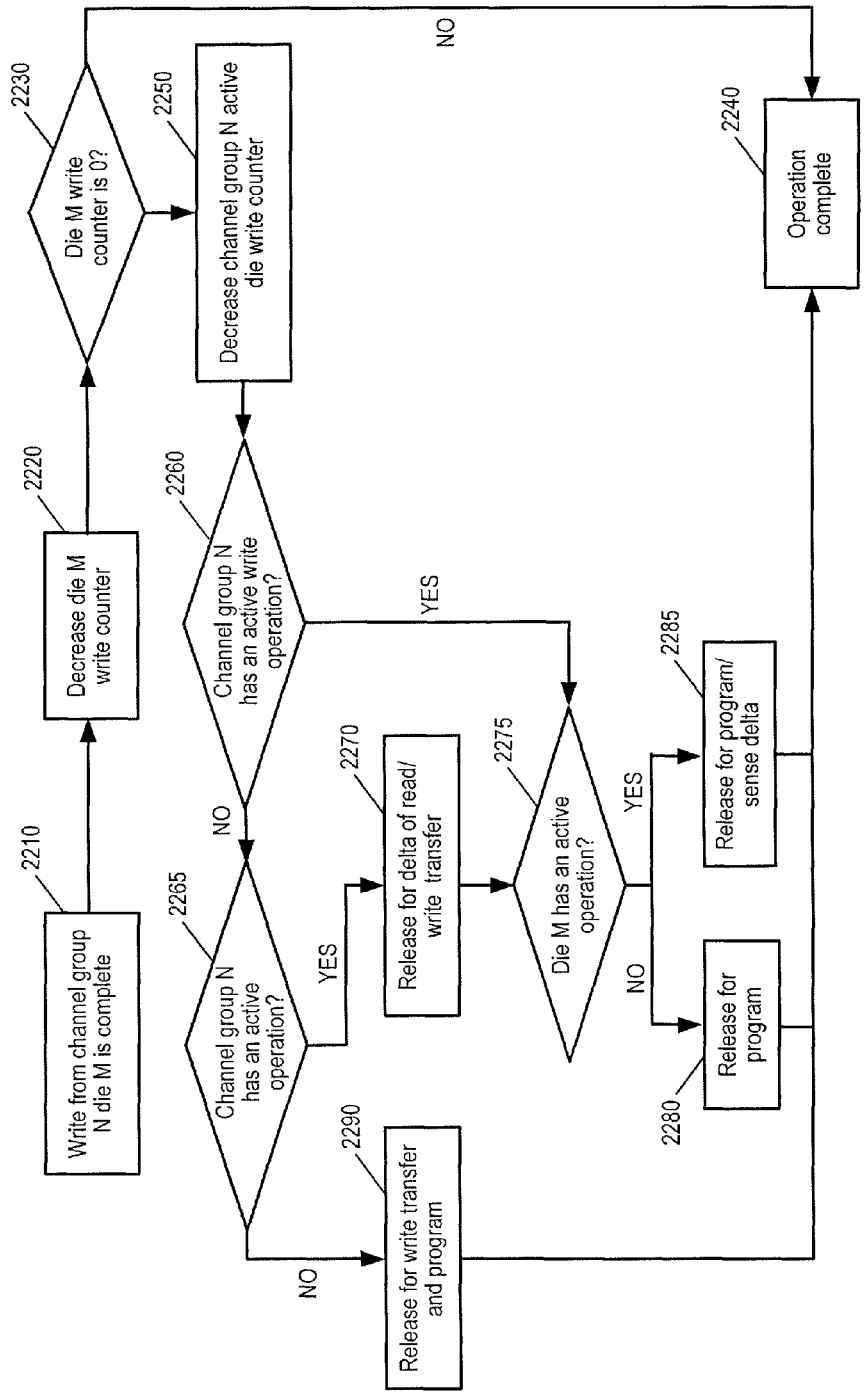
FIG. 22 is a flow chart of a write-release-token process of an embodiment.

FIG. 22 is a flow chart of a write-release-token process of an embodiment. First, the write from die M in channel group N is complete (act 2210). The controller 102 decreases the die M write counter (act 2220) and determines if the die M write counter is 0 (act 2230). If it is, the controller 102 decreases the channel group N active die write counter (act 2250) and then determines if channel group N has an active write operation (act 2260). If it does, the controller 102 determines whether die M has an active read operation (act 2275). If die M has an active read operation, the controller 102 releases the tokens for the program/sense delta (act 2285). If die M does not have an active read operation, the controller 102 releases the tokens for the program (act 2280).

If channel group N does not have an active write operation, the controller 102 determines if channel group N has an active operation (act 2265). If it does, the controller releases the tokens for the delta of the read/write transfer (act 2270) and then proceeds to act 2275, which was discussed above. If channel group N does not have an active operation, the controller 102 releases the tokens for the write transfer and program (act 2290).

Returning to the drawings, FIGS. 23-26 illustrate another embodiment, in which the power token concept can be used in a method for adaptive thermal throttling. At the outset, it should be noted that while power tokens are used in one particular embodiment, adaptive thermal throttling can be implemented without the use of power tokens. These and other variations will be discussed below.

Figure 23:
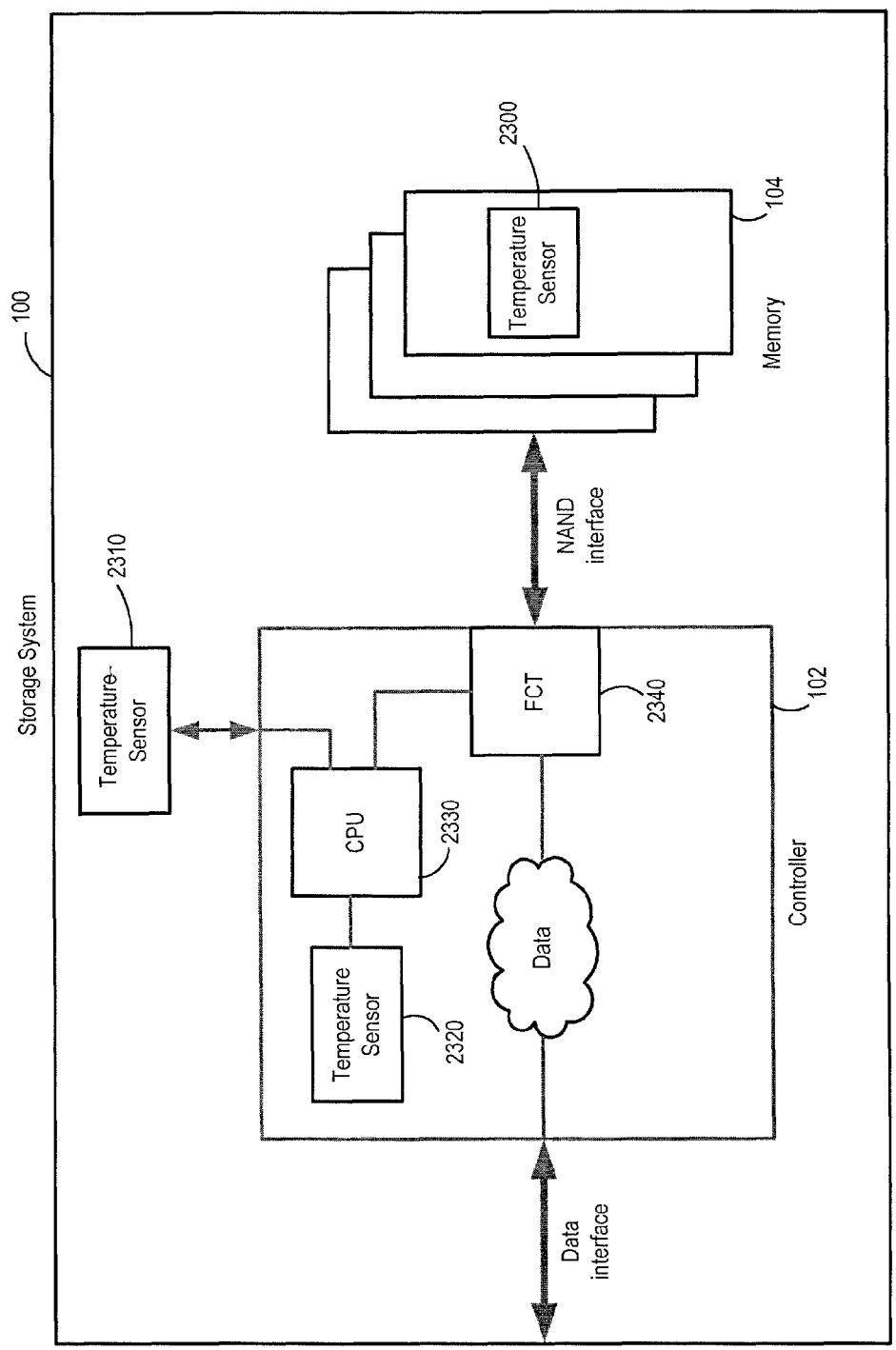
FIG. 23 is a block diagram of a storage system of an embodiment.

As shown in FIG. 23, in one embodiment, the storage system 100 contains one or more temperature sensors 2300, 2310, 2320 in the memory 104, inside the housing of the storage system 100, and/or in the controller 102 (which, in this embodiment, is in communication with the memory 104 via a fast CMOS technology (FCT) interface 2340), respectively. Although three temperature sensors 2300, 2310, 2320 are shown in FIG. 23, it should be understood that fewer or more temperature sensors can be used and that a temperature sensor may be located in a different location than shown in FIG. 23.

In operation, a CPU 2330 in the controller 102 reads temperature values from one or more of the temperature sensors 2300, 2310, 2320 and takes certain actions based on the read temperature (e.g., by executing the algorithm discussed below to control NAND interface performance using a power token mechanism. As used herein, the temperature of the storage system 100 can mean the temperature taken from one or more of the temperature sensors 2300, 2310, 2320 and/or of other temperature sensors. Additionally, temperature can be measured or inferred from other factors other than from a sensor.

In some prior storage systems, when the reading of the temperature sensor goes above some threshold value (e.g., defined in the specifications for the storage system), the controller of the storage system automatically reduces performance of the storage system by a predetermined amount (e.g., a fixed step of 50% and/or 70%) to cool down the controller and/or memory. This is referred to as "thermal throttling." The power token mechanism discussed in the above embodiments can be used to control power usage by limiting the power tokens used by the controller 102 and assigned for each operation. After the temperature has cooled down and the storage system is below the threshold, the storage system can increase performance back up to full performance power.

Figure 24:
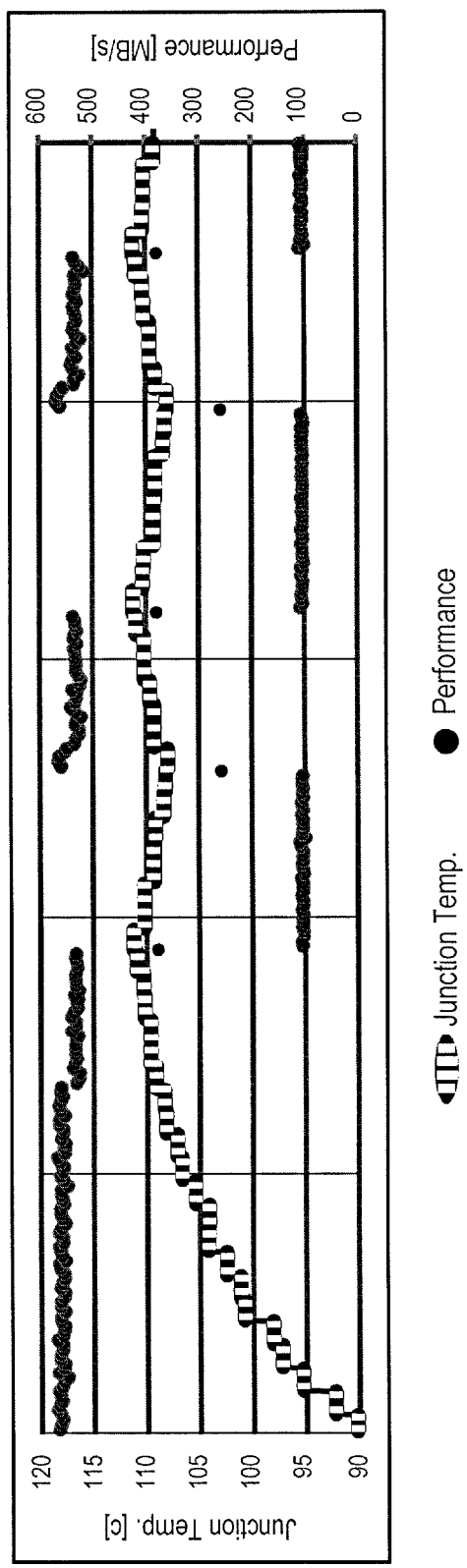
FIG. 24 is a diagram of junction temperature and performance of an embodiment.

The inventors have discovered that when performance is reduced in fixed steps (e.g., of 50% or 70%), for certain platforms, performance decreases more that it needs to, which causes the overall performance of the storage system to be lower than expected. An example of this problem is shown in the performance and junction temperature graph in FIG. 24. As shown in FIG. 24, when the junction temperature (i.e., the temperature of a transistor juncture in the storage system 100) is over about 112° C., the controller of the storage system enters thermal throttling mode, in which performance of the storage system is reduced by about 80% (i.e., from about 550 MB/s to about 100 MB/s) by, for example, reducing the number of power tokens available by 80%. When the junction temperature is under about 107° C., the controller of the storage system exits thermal throttling mode, and performance of the storage system jumps back to about 550 MB/s. The temperature keeps bouncing above and below the temperature thresholds, which causes the storage system to bounce performance between 550 MB/s and 100 MB/s. This can happen, for example, when a user is downloading a large file. The storage system gets hot, performance is reduced, performance is increase, then reduced again, etc.

The inventors have found that this "ping-ponging" of performance is due to having a large, fixed performance reduction step that may be too large for some platforms and has a negative impact on user experience. To address this issue, the following embodiment provides adaptive thermal throttling, which can provide a more optimal way of using thermal throttling to reduce performance to a maximum value while keeping the storage system 100 within its thermal specifications. Ideally, with this embodiment, the overall performance of the storage system 100 will be maximized, with the user not noticing fluctuations in system behavior. To do this, this embodiment discards the idea of using generic, large, fixed performance reduction steps, which, while relevant to one system, may be irrelevant to other systems. Instead, this embodiment determines a given system's target performance level. In general, this embodiment uses an adaptive thermal throttling algorithm that uses a closed-loop control mechanism that samples the system's temperature level and varies the performance based on that. The performance preferably changes in relatively small steps until the system 100 gets into thermal steady state. In this way, the adaptive mechanism of this embodiment has a learning capability. Once the system 100 has found its steady state value using the closed-control loop algorithm, the value can be saved (e.g., in a lookup table) for use the next time the temperature exceeds its critical threshold value. That is, the next time the system 100 senses a certain ambient condition, it will know the specific performance value needed to get into thermal steady state. So, over time, the thermal throttling algorithm will know the optimized value for all relevant conditions and will find the optimal value for each specific platform. This embodiment will now be discussed in more detail in conjunction with the flow chart 2500 of FIG. 25. The method shown in this flow chart 2500 can be performed during manufacturing or initialization of the storage system 100 or can be performed in the field. In one embodiment, this method is executed by the controller 102 of the storage system 100 (e.g., by executing software or firmware retrieved from a memory in the storage system 100).

Figure 25:
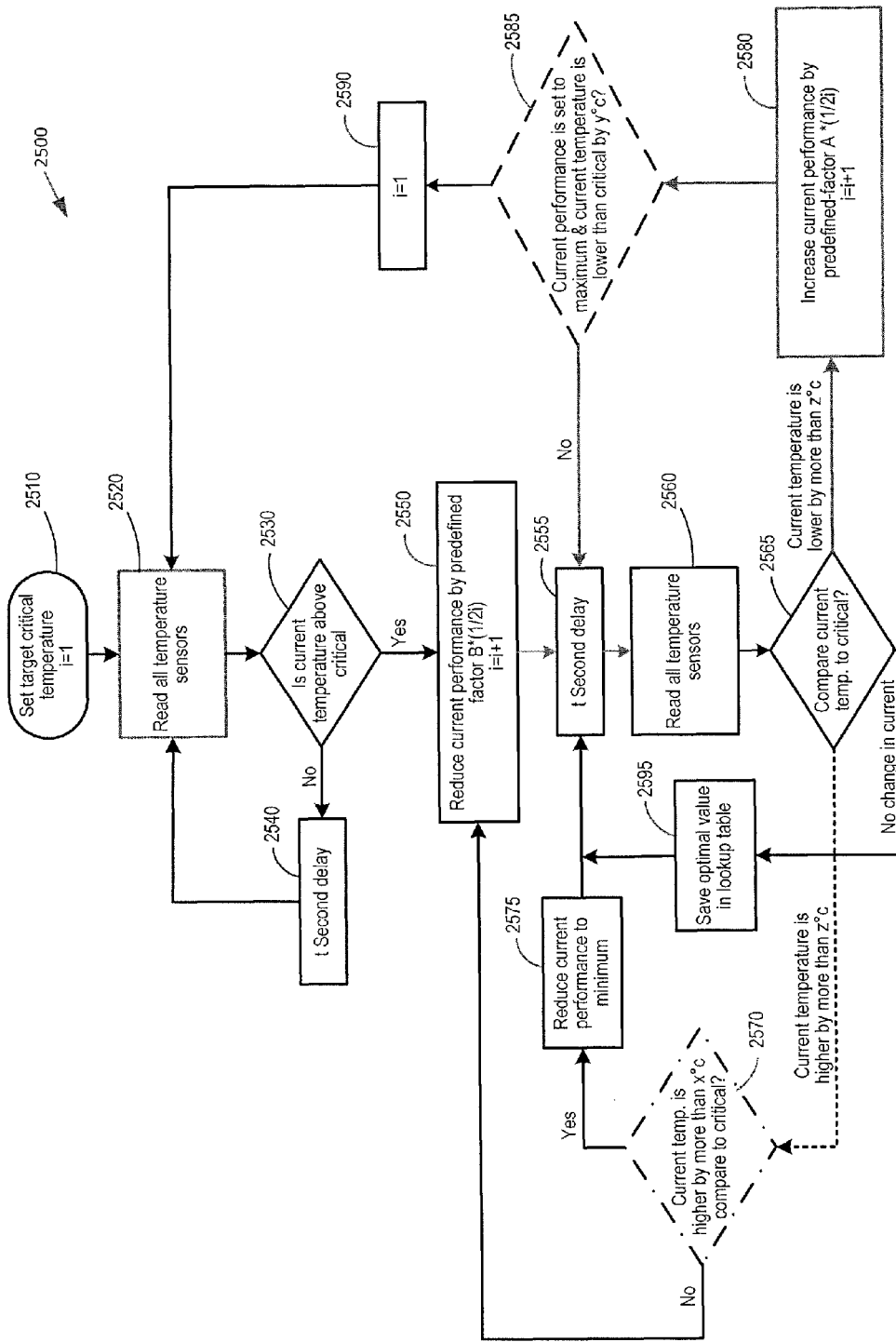
FIG. 25 is a flow chart of an embodiment for adaptive thermal throttling.

As shown in FIG. 25, the first step in this process is for the target critical temperature to be set and for variable i to be set to 1 (act 2510). The target critical temperature can be set by the manufacturer or can be set by the host using the storage system 100. In this way, the host can change the thermal throttling critical point (the temperature threshold) on the fly for a specific need (e.g., if the host wants to cool down one section on the platform while another section is overheated). Next, the controller 102 reads the temperature sensors 2300, 2310, 2320 (act 2520). As mentioned above, in other embodiments, some or different ones of the temperature sensors 2300, 2310, 2320 can be used.

Then, the controller 102 determines if the temperature of the storage system 100 is above the critical threshold temperature (act 2530). This can involve using the highest temperature reading from any sensor 2300, 2310, 2320, taking an average of the sensors, etc. If the temperature of the storage system 100 is not above the critical threshold temperature, the controller 102 inserts a t second delay (act 2540) and then re-reads the temperature sensors 2300, 2310, 2320 (act 2520). If the temperature of the storage system 100 is above the critical threshold temperature, the controller 102 starts the thermal throttling process.

In the thermal throttling process, the controller 102 first reduces the current performance of the storage system 100 (act 2550). In one embodiment, the performance is reduced by an amount smaller than the relatively-large step used in prior thermal throttling processes. In one particular implementation, performance is reduced by a predefined factor (B) (e.g., set during system initialization) multiplied by ½ i. The variable i is then increased by one for later use. As discussed above, performance can be reduced by reducing a number of power tokens that are available to perform memory operations. The above embodiments discuss various ways in which the power token concept can be used to reduce performance. However, it should be noted that the below claims should not be read to require the use of power tokens unless expressly recited therein, as there are various other ways in which performance can be reduced. For example, instead of using power tokens, the storage system 100 can merely add delays between read and/or write commands.

After the performance of the storage system 100 has been reduced, the controller 102 inserts a t second delay (act 2555) and then reads all the temperature sensors 2300, 2310, 2320 again (act 2560) to see how the current temperature compares to the critical temperature (act 2565). In this embodiment, the system 100 is striving to keep the temperature in a temperature envelop or range of less than + or −z° C. from the threshold temperature ("about the threshold temperature"), where z is predefined factor. (It should be understood, that the "envelope" can be tailored such that it just includes one temperature, is above but not below the temperature, or vice versa, etc.) So, if the temperature of the storage system 100 is higher than +z° C. from the threshold temperature (but not by more than a certain margin (here, x° C. from the threshold temperature, where x is another predefined factor) (act 2570)), performance is again reduced (act 2550), and the above-described loop is repeated. If the current temperature is higher than a certain margin (e.g., x° C.) above the critical temperature (act 2570), that can mean that the performance reduction is not happening fast enough and that there is a risk of damage to the storage system 100. In that case, the controller 102 can reduce the current performance to a minimum amount (e.g., by 80%) to quickly cool down the storage system 100 (act 2575).

On the other hand, if the current temperature is lower than the temperature envelop, that means that the controller 102 "overshot" the performance reduction. In that case, the controller 102 can increase the current performance (act 2580). In one particular implementation, performance is increased by a predefined factor (A) (e.g., set during system initialization) multiplied by ½ i, and the variable i is increased by one for later use. The controller 102 then determines if the current performance is set to the maximum and the current temperature is lower than the critical temperature by a certain margin (here, y° C., where y is another predefined factor) (act 2585). If it's not, the controller 102 inserts a t second delay (act 2555) and reads all the temperature sensors 2300, 2310, 2320 again (act 2560) to see how the current temperature compares to the critical temperature (act 2565). If it is, the controller 102 sets i to be one (act 2590) and starts the process again at act 2520.

Through this iterative process of decreasing and/or increasing the performance, eventually, the current temperature will stabilize to the desired temperate range/thermal envelop (here, less than + or −z° C. of the critical temperature). In that case, the optimal performance values (e.g., 20% reduction) are stored in the storage system 100 (e.g., in a lookup table) (act 2595). In this way, the next time the temperature of the storage system 100 is above the critical value, the controller 102 can retrieve and use the stored value instead of "re-learning" it. When this value is first stored or is later retrieved and used, the controller 102 can still monitor the storage system's temperature (act 2565) to see if any tweaking needs to be done to the performance value to keep the system 100 in the proper temperature envelop.

Figure 26:
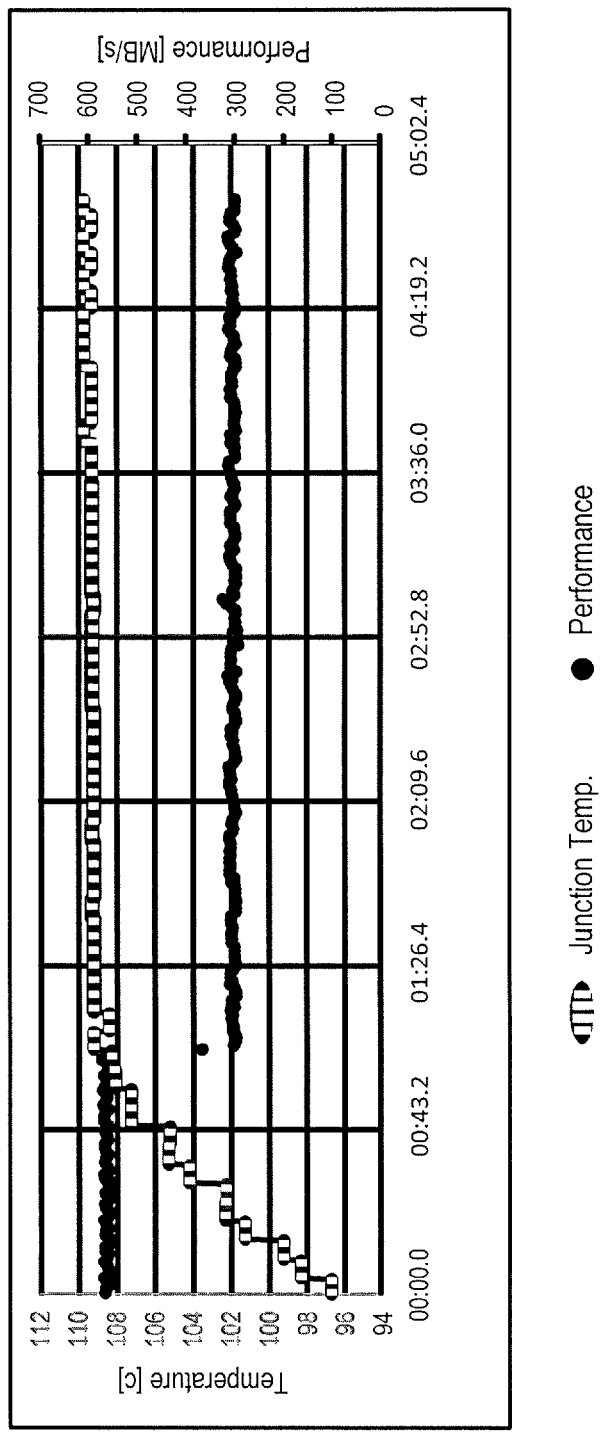
FIG. 26 is a diagram of junction temperature and performance of an embodiment.

FIG. 26 is a diagram of junction temperature and performance generated using the adaptive thermal throttling embodiment discussed above. As shown in this drawing, after the critical temperature is reached, the performance is reduced, but it is a steady level and does not "ping-pong" like the prior method shown in FIG. 24. (The steady level is maintained here for the remainder of the ongoing operation (e.g., download), then returns to the pre-throttling level for the next operation, assuming the temperature of the system 100 has cooled down sufficiently.)

In summary, this embodiment provides an adaptive thermal throttling mechanism that converges to a stable system temperature with a high-enough system performance to maintain the steady-state temperature. The target temperature may not be known in advance and may be changed from platform to platform, as well as dynamically changed by the host during operation. With the closed-loop system disclosed in this embodiment, if the temperature increases beyond the target temperature, the system 100 is configured to reduce the power token threshold (or using another mechanism) such that the temperature will be maintained. If the temperature goes below the desired target temperature, the system 100 may increase the power token threshold to increase the temperature and keep tracking the temperature and changing the power token threshold continuously in a closed-loop system with a feedback from one or more temperature sensor(s). For example, if a fixed step of 50% or 70% reduction in the power token threshold is used, the performance reduction may be too severe. With these embodiment, the temperature can be maintained below the critical temperature (e.g., 110° C.) with only a 28% performance reduction. Thus, the closed-loop system presented in this embodiment allows the system 100 to converge to a stable temperature and provide maximal processor performance that maintains a stable temperature per platform based on the power management token system or other throttling mechanisms. Furthermore, as mentioned above, the host can be allowed to change the temperature threshold dynamically.

There are many advantages associated with these embodiments. For example, in one implementation of these embodiments, performance can be improved by about 15% compared to thermal throttling using fixed steps. Additionally, maintaining a stable optimal temperature will improve the storage system's performance in terms of cross temperature, where maintaining a fixed range of read and write temperatures is beneficial for storage systems, as well as endurance.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for adaptive thermal throttling, the method comprising:
  performing the following in a storage system having a memory:
    determining if a temperature of the storage system is above a threshold temperature; and
    in response to determining that the temperature of the storage system is above the threshold temperature:
      reducing performance of the storage system in an iterative manner by reducing a number of memory operations performed over time until the temperature of the storage system is within a temperature envelope around the threshold temperature; and
      storing, in the memory, a value indicating what the performance of the storage system was reduced to in order to get the temperature within the temperature envelope.

2. The method of claim 1 further comprising:
  reducing performance of the storage system to the stored value a next time that the temperature of the storage system is above threshold temperature.

3. The method of claim 1 further comprising:
increasing performance of the storage system responsive to the temperature of the storage system being below a lower limit of the temperature envelope.

4. The method of claim 1 further comprising:
reducing performance of the storage system to a minimum performance value in response to the temperature of the storage system being above a higher limit of the temperature envelope by more than a certain margin.

5. The method of claim 1, wherein the method is performed during initialization of the storage system.

6. The method of claim 1, wherein the number of memory operations performed over time is reduced by reducing a number of power tokens that are available to perform memory operations.

7. The method of claim 1, wherein the number of memory operations performed over time is reduced by inserting delays between read and/or write commands.

8. The method of claim 1, wherein the memory is a three-dimensional memory.

9. The method of claim 1, wherein the storage system is embedded in a host.

10. The method of claim 1, wherein the storage system is removably connected to a host.

11. A storage system comprising:
a memory; and
a controller in communication with the memory, wherein the controller is configured to:
   detect that a temperature of the storage system exceeds a critical temperature;
   throttle execution of memory commands to bring the temperature of the storage system to about the critical temperature;
   save throttling parameters that were used to bring the temperature of the storage system to about the critical temperature; and
   use the throttling parameters responsive to the temperature of the storage system again exceeding the critical temperature.

12. The storage system of claim 11, wherein the controller is further configured to increase execution of memory commands responsive to the temperature of the storage system being below the critical temperature by more than a predefined amount.

13. The storage system of claim 11, wherein the controller is further configured to throttle execution of memory commands to a minimum amount responsive to the temperature of the storage system being above the critical temperature by more than a predefined amount.

14. The storage system of claim 11, wherein the controller is configured to throttle execution of memory commands by reducing a number of power tokens that are available to perform memory commands.

15. The storage system of claim 11, wherein the controller is configured to throttle execution of memory commands by inserting delays between the memory commands.

16. The storage system of claim 11, wherein the memory is a three-dimensional memory.

17. The storage system of claim 11, wherein the storage system is embedded in a host.

18. The storage system of claim 11, wherein the storage system is removably connected to a host.

19. A storage system comprising:
a memory; and
means for, responsive to a temperature of the storage system being greater than a target temperature, reducing a number of memory operations performed over time until the temperature of the storage system is under the target temperature;
means for storing, in the memory, a value indicating what the number of memory operations performed over time was reduced to in order to get the temperature of the storage system under the target temperature; and
means for reducing a number of memory operations performed over time to the value stored in the memory responsive to the temperature of the storage system being again greater than the target temperature.

20. The storage system of claim 19, wherein the means for reducing the number of memory operations performed over time until the temperature of the storage system is under the target temperature and the means for reducing the number of memory operations performed over time to the value stored in the memory responsive to the temperature of the storage system being again greater than the target temperature both comprise a controller.

21. The storage system of claim 19, wherein the means for reducing the number of memory operations performed over time until the temperature of the storage system is under the target temperature and the means for reducing the number of memory operations performed over time to the value stored in the memory responsive to the temperature of the storage system being again greater than the target temperature both uses power tokens to reduce the number of memory operations performed over time.

22. The storage system of claim 19, wherein the memory is a three-dimensional memory.

23. The storage system of claim 19, wherein the storage system is embedded in a host.

24. The storage system of claim 19, wherein the storage system is removably connected to a host.

* * * * *